US012628511B2

(12) United States Patent
Lee et al.

(10) Patent No.: US 12,628,511 B2
(45) Date of Patent: May 12, 2026

(54) DISPLAY APPARATUS

(71) Applicant: Samsung Display Co., Ltd., Yongin-si (KR)

(72) Inventors: Wonse Lee, Yongin-si (KR); Seungwoo Sung, Yongin-si (KR); Yunkyeong In, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 509 days.

(21) Appl. No.: 18/192,617

(22) Filed: Mar. 29, 2023

(65) Prior Publication Data

US 2024/0040863 A1 Feb. 1, 2024

(30) Foreign Application Priority Data

Aug. 1, 2022 (KR) ........................ 10-2022-0095685

(51) Int. Cl.
 *H10K 59/126* (2023.01)
 *H10K 59/131* (2023.01)
(52) U.S. Cl.
 CPC ......... *H10K 59/126* (2023.02); *H10K 59/131* (2023.02)
(58) Field of Classification Search
 CPC .. H10K 59/126; H10K 59/131; H10K 59/123; H10K 59/12; H10K 50/805; H10D 86/421; H10D 86/423; H10D 86/60; H10D 86/441
 See application file for complete search history.

(56) References Cited

U.S. PATENT DOCUMENTS

| | | | |
|---|---|---|---|
| 7,545,354 B2 | 6/2009 | Ha et al. | |
| 8,633,490 B2 | 1/2014 | Park et al. | |
| 2020/0105849 A1 | 4/2020 | Kim et al. | |
| 2020/0373369 A1* | 11/2020 | Kang | H10K 59/123 |
| 2021/0057451 A1* | 2/2021 | Chen | H10D 86/441 |
| 2021/0074783 A1 | 3/2021 | Kang et al. | |
| 2021/0375215 A1 | 12/2021 | Cho et al. | |
| 2023/0389380 A1* | 11/2023 | Shin | H10D 86/441 |

FOREIGN PATENT DOCUMENTS

| | | |
|---|---|---|
| KR | 10-1130903 B1 | 3/2012 |
| KR | 10-1908383 B1 | 12/2018 |
| KR | 10-2019-0108220 A | 9/2019 |
| KR | 10-2020-0037027 A | 4/2020 |
| KR | 10-2021-0029339 A | 3/2021 |
| KR | 10-2021-0148547 A | 12/2021 |

* cited by examiner

*Primary Examiner* — Sitaramarao S Yechuri
(74) *Attorney, Agent, or Firm* — Womble Bond Dickinson (US) LLP

(57) ABSTRACT

A display apparatus includes: a first semiconductor layer on a substrate; a first gate layer on the first semiconductor layer, and including a driving gate electrode; a second gate layer on the first gate layer, and including an initialization gate line extending in a first direction; a second semiconductor layer on the second gate layer, and including a shield layer to receive a constant voltage; a second connection electrode layer on the second semiconductor layer, and including a horizontal connection line extending in the first direction; and a third connection electrode layer on the second connection electrode layer, and including a vertical connection line extending in a second direction crossing the first direction.

33 Claims, 25 Drawing Sheets

DISPLAY APPARATUS

CROSS-REFERENCE TO RELATED APPLICATION

This application claims priority to and the benefit of Korean Patent Application No. 10-2022-0095685, filed on Aug. 1, 2022, in the Korean Intellectual Property Office, the entire disclosure of which is incorporated by reference herein.

BACKGROUND

1. Field

Aspects of one or more embodiments relate to a display apparatus, and more particularly, to a display apparatus capable of displaying a high-quality image.

2. Description of the Related Art

In general, in a display apparatus, such as an organic light-emitting display apparatus, thin-film transistors are arranged in each (sub)pixel to control the luminance of each (sub)pixel. These thin-film transistors control the luminance of a corresponding (sub)pixel according to a transmitted data signal and/or the like.

The data signal is transmitted from a driver to each corresponding (sub)pixel through a data line. The driver is located in a peripheral area outside a display area.

The above information disclosed in this Background section is for enhancement of understanding of the background of the present disclosure, and therefore, it may contain information that does not constitute prior art.

SUMMARY

In a display apparatus, the quality of an image displayed at (e.g., in or on) a display area may deteriorate when the area of a region where a driver is located is wide, or the area is reduced.

One or more embodiments of the present disclosure are directed to a display apparatus capable of displaying a high-quality image. However, the aspects, features, and scope of the present disclosure are not limited thereto.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a first semiconductor layer on a substrate; a first gate layer on the first semiconductor layer, and including a driving gate electrode; a second gate layer on the first gate layer, and including an initialization gate line extending in a first direction; a second semiconductor layer on the second gate layer, and including a shield layer configured to receive a constant voltage; a second connection electrode layer on the second semiconductor layer, and including a horizontal connection line extending in the first direction; and a third connection electrode layer on the second connection electrode layer, and including a vertical connection line extending in a second direction crossing the first direction.

In an embodiment, the second gate layer may further include a first initialization voltage line extending in the first direction, and the shield layer may be electrically connected to the first initialization voltage line.

In an embodiment, the display apparatus may further include a first connection electrode layer on the second semiconductor layer, and including a connection electrode electrically connecting the shield layer to the first initialization voltage line, and the second connection electrode layer may be on the first connection electrode layer.

In an embodiment, the second semiconductor layer may include an oxide semiconductor layer overlapping with the initialization gate line, and the shield layer may include a same material as that of the oxide semiconductor layer.

In an embodiment, the shield layer and the oxide semiconductor layer may be integral with each other as a single body.

In an embodiment, the shield layer may extend in the first direction.

In an embodiment, the shield layer may be an integral single body with respect to pixels located along the first direction.

In an embodiment, the shield layer may overlap with the horizontal connection line.

In an embodiment, the horizontal connection line may be located within the shield layer in a plan view.

In an embodiment, the shield layer may include a portion overlapping with the initialization gate line.

In an embodiment, the third connection electrode layer may further include a data line extending in the second direction, and the vertical connection line may be electrically connected to the data line and the horizontal connection line.

In an embodiment, the substrate may include a display area, and a peripheral area outside the display area, and the vertical connection line may be electrically connected to the data line at the peripheral area.

In an embodiment, the vertical connection line and the data line may be integral with each other as a single body.

In an embodiment, the horizontal connection line may be electrically connected to the vertical connection line at the display area.

In an embodiment, the vertical connection line may be connected to the horizontal connection line via a contact hole, and the second connection electrode layer may further include an auxiliary horizontal connection line spaced from the horizontal connection line, the auxiliary horizontal connection line being electrically insulated from the horizontal connection line and the data line, and having an extension axis that is the same as an extension axis of the horizontal connection line.

In an embodiment, the shield layer may extend in the first direction, may overlap with the horizontal connection line, and may not overlap with the auxiliary horizontal connection line.

In an embodiment, the display apparatus may further include a first connection electrode layer on the second semiconductor layer, and including a second initialization voltage line extending in the first direction. The second connection electrode layer may be on the first connection electrode layer, and the shield layer may be electrically connected to the second initialization voltage line.

In an embodiment, the second semiconductor layer may include an oxide semiconductor layer overlapping with the initialization gate line, and the shield layer may include a same material as that of the oxide semiconductor layer.

In an embodiment, the shield layer may extend in the first direction, and may be spaced from the oxide semiconductor layer.

In an embodiment, the shield layer may overlap with the horizontal connection line.

In an embodiment, the shield layer may include a portion overlapping with the initialization gate line.

In an embodiment, the third connection electrode layer may further include a driving voltage line extending in the second direction, and the shield layer may be electrically connected to the driving voltage line.

In an embodiment, the second semiconductor layer may include an oxide semiconductor layer overlapping with the initialization gate line, and the shield layer may include a same material as that of the oxide semiconductor layer.

In an embodiment, the shield layer may extend in the first direction, and may be spaced from the oxide semiconductor layer.

In an embodiment, the shield layer may overlap with the horizontal connection line.

In an embodiment, the shield layer may include a portion overlapping with the initialization gate line.

The above and/or other aspects and features of the present disclosure will become apparent and more readily appreciated from the following description of the embodiments, the accompanying drawings, and claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
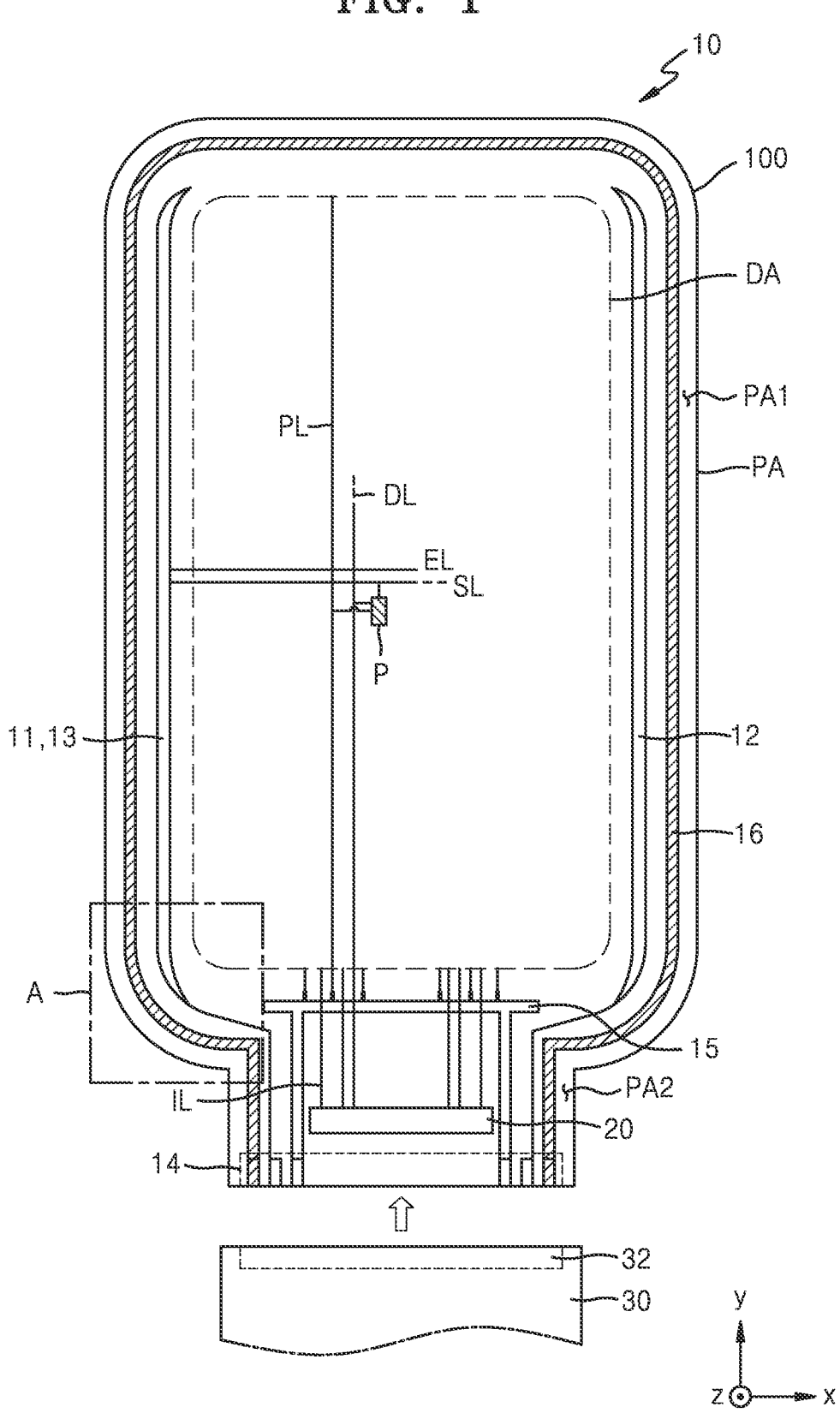
FIG. 1 is a plan view schematically illustrating a portion of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same time or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view schematically illustrating a portion of a display apparatus according to an embodiment. Referring to FIG. 1, the display apparatus according to the present embodiment may include a display panel 10. The display apparatus may be any suitable display apparatus that includes the display panel 10. For example, the display apparatus may include various suitable products, such as smartphones, tablet personal computers (PCs), laptop PCs, televisions, advertisement boards, and the like.

The display panel 10 may include a display area DA, and a peripheral area PA outside the display area DA. The display area DA may include a portion where an image is displayed, and a plurality of pixels may be arranged at (e.g., in or on) the display area DA. When viewed in a direction (e.g., a z-axis direction) perpendicular to or substantially perpendicular to (e.g., a surface of) the display panel 10 (e.g., in a plan view), the display panel 10 may have various suitable shapes, such as a circle, an ellipse, a polygon, or a particular figure. In FIG. 1, the display area DA is illustrated as having a rectangular or substantially rectangular shape with rounded corners.

The peripheral area PA may be arranged outside the display area DA. The peripheral area PA may include a first peripheral area PA1 that at least partially surrounds (e.g., around a periphery of) one corner (e.g., in a −y direction and an −x direction) of the display area DA, and a second peripheral area PA2 located on one side outside the display area DA (e.g., in the −y direction). The second peripheral area PA2 may be located adjacent to the first peripheral area PA1. In other words, the second peripheral area PA2 may be located in a direction relatively toward the center (e.g., in the x-axis direction) of the display panel 10 with respect to the first peripheral area PA1. The width (e.g., in the x-axis direction) of the second peripheral area PA2 may be less than the width (e.g., in the x-axis direction) of the display area DA. According to this structure, at least a portion of the second peripheral area PA2 may be easily bendable, as described in more detail below.

The display panel 10 includes a substrate 100, and thus, it may be understood that the substrate 100 includes the display area DA and the peripheral area PA. Hereinafter, the substrate 100 may be described as including the display area DA and the peripheral area PA, for convenience.

The display panel 10 may be bent about a bending axis (e.g., extending in the x-axis direction) in at least a portion of the second peripheral area PA2. In this case, when viewed in the z-axis direction (e.g., in a plan view), a portion of the second peripheral area PA2 may overlap with the display area DA. However, the present disclosure is not limited to a bendable display apparatus, and embodiments of the present disclosure may be applicable to a display apparatus that is not bendable. The second peripheral area PA2 may include a non-display area. By bending the display panel 10, when the display apparatus is viewed from the front (e.g., in the −z direction), the non-display area may not be visible. Further, even in a case in which the non-display area is visible, the visible area of the non-display area may be reduced.

A driving chip 20 may be arranged at (e.g., in or on) the second peripheral area PA2 of the display panel 10. The driving chip 20 may include an integrated circuit configured to drive the display panel 10. The integrated circuit may include a data driving integrated circuit configured to generate a data signal, but the present disclosure is not limited thereto.

The driving chip 20 may be mounted at (e.g., in or on) the second peripheral area PA2 of the display panel 10. The driving chip 20 is mounted on the same surface as that of the display surface of the display area DA, and when the display panel 10 is bent in the second peripheral area PA2, as described above, the driving chip 20 may be located on the rear surface of the display area DA.

A printed circuit board 30 or the like may be attached to an end of the second peripheral area PA2 of the display panel 10. The printed circuit board 30 or the like may be electrically connected to the driving chip 20 or the like through a pad on the substrate 100.

Although an organic light-emitting display apparatus is described in more detail hereinafter as an example of the display apparatus according to an embodiment, the display apparatus of the present disclosure is not limited thereto. In another embodiment, the display apparatus of the present disclosure may include any suitable display apparatus, such as an inorganic light-emitting display apparatus (e.g., an inorganic light-emitting display or an inorganic electroluminescent (EL) display apparatus) or a quantum dot light-emitting display. For example, an emission layer of the display element included in the display apparatus may include an organic material or an inorganic material. In addition, the display apparatus may include an emission layer, and quantum dots positioned on a path of light emitted from the emission layer.

As described above, the display panel 10 may include the substrate 100. Various elements included in the display panel 10 may be disposed over the substrate 100. The substrate 100 may include glass, a metal, or a polymer resin. When the display panel 10 is bent in the second peripheral area PA2 as described above, the substrate 100 may be flexible and/or bendable. In this case, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the present disclosure is not limited thereto, and various modifications may be made. For example, the substrate 100 may have a multi-layered structure including two or more layers, and a barrier layer therebetween. In this case, each of the two layers may include a polymer resin, and the barrier layer may include an inorganic material, such as silicon oxide, silicon nitride, and/or silicon oxynitride, but the present disclosure is not limited thereto.

A plurality of pixels P may be at (e.g., in or on) the display area DA. Each of the pixels P refers to a sub-pixel, and may include a display element, such as an organic light-emitting diode, and a pixel circuit electrically connected to the display element. The pixel P may emit, for example, such as red, green, blue, or white light. The pixel P may be electrically connected to one or more external circuits arranged at (e.g., in or on) the peripheral area PA. A first scan driving circuit 11, a second scan driving circuit 12, an emission control driving circuit 13, a terminal 14, a first power supply line 15, and a second power supply line 16 may be arranged at (e.g., in or on) the peripheral area PA.

The first scan driving circuit 11 may provide a scan signal to the pixel P through a scan line SL. The second scan driving circuit 12 may be arranged in parallel or substantially in parallel with the first scan driving circuit 11, with the display area DA therebetween. Some of the pixels P arranged at (e.g., in or on) the display area DA may be electrically connected to the first scan driving circuit 11, and others of the pixels P may be connected to the second scan driving circuit 12. However, the second scan driving circuit 12 may be omitted as needed or desired, and in this case, all of the pixels P arranged at (e.g., in or on) the display area DA may be electrically connected to the first scan driving circuit 11.

Figure 3:
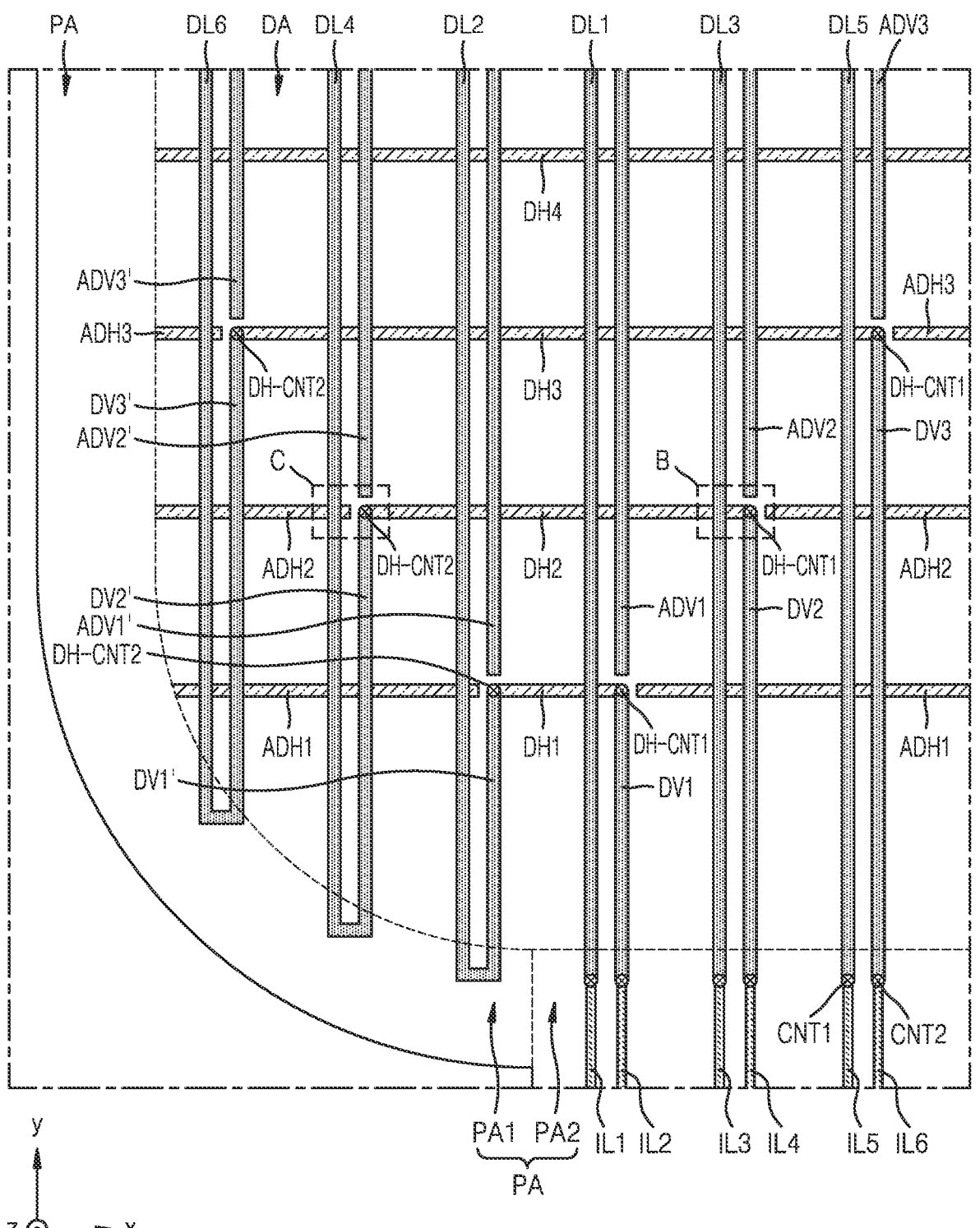

The emission control driving circuit 13 may be arranged at (e.g., in or on) or next to (e.g., adjacent to) the first scan driving circuit 11, and may provide an emission control signal to the pixel P through an emission control line EL. In FIG. 3, the emission control driving circuit 13 is illustrated as being arranged at (e.g., in or on) one side of the display area DA. However, the emission control driving circuit 13 may be arranged at two side (e.g., at opposite sides) of the display area DA, like the first scan driving circuit 11 and the second scan driving circuit 12.

The terminal 14 may be arranged at (e.g., in or on) the second peripheral area PA2 of the substrate 100. The terminal 14 may be exposed without being covered by an insulating layer, and may be electrically connected to the printed circuit board 30. A terminal 32 of the printed circuit board 30 may be electrically connected to the terminal 14 of the display panel 10.

The printed circuit board 30 transmits a signal and/or power from a controller to the display panel 10. Control signals generated by the controller may be transmitted to the first and second scan driving circuits 11 and 12 and the emission control driving circuit 13 through the printed circuit board 30. In addition, the controller may transmit a first power voltage ELVDD (e.g., see FIG. 4) to the first power supply line 15, and may provide a second power voltage ELVSS (e.g., see FIG. 4) to the second power supply line 16. The first power voltage ELVDD, which is a driving voltage, may be transmitted to each pixel P through a driving voltage line PL connected to the first power supply line 15. The second power voltage ELVSS, which is a common voltage, may be transmitted to an opposite electrode 230 (see FIG. 4) of the pixel P connected to the second power supply line 16. The first power supply line 15 may have a shape extending in one direction (e.g., the x-axis direction) at (e.g., in or on) a lower side of the peripheral area PA. The second power supply line 16 may have a loop shape with one side open, and that partially surrounds (e.g., around a periphery of) the display area DA.

The controller may generate a data signal, and the generated data signal may be transmitted to an input line IL through the driving chip 20 to be transmitted to the pixel P through a data line DL connected to the input line IL.

For reference, as used in the present disclosure, a "line" may refer to a "wiring line".

Figure 2:
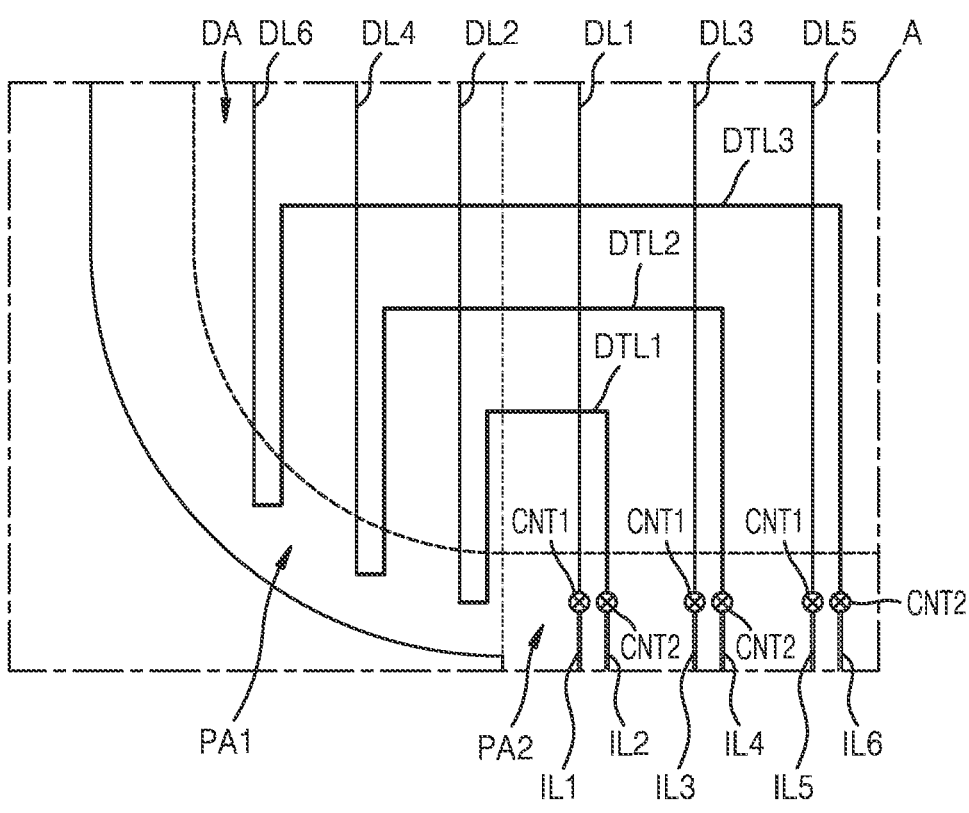
FIGS. 2-3 are enlarged plan views schematically illustrating the portion A of the display apparatus shown in FIG. 1.

FIGS. 2 and 3 are enlarged plan views schematically illustrating the portion A of the display apparatus shown in FIG. 1.

Various signals may be applied to the display area DA. For example, a data signal for adjusting the brightness of a pixel P may be applied to the display area DA. In more detail, referring to FIG. 2, a plurality of data lines (e.g., first to sixth data lines DL1 to DL6) may be located at (e.g., in or on) the display area DA. The data lines DL1 to DL6 may be arranged along a first direction (e.g., the x-axis direction) to be parallel to or substantially parallel to each other, and may each extend in a second direction (e.g., the y-axis direction) crossing the first direction. In some embodiments, first to sixth data lines DL1 to DL6 may have shapes extending from the peripheral area PA into the display area DA, for example, as shown in FIG. 2. Various lines other than the first to sixth data lines DL1 to DL6, such as a power line and a scan line, may also be located inside and outside the display area DA.

A first input line IL1 to a sixth input line IL6 may be located at (e.g., in or on) the peripheral area PA, or in more detail, the second peripheral area PA2. The first input line IL1 to the sixth input line IL6 may be connected to the driving chip 20 to receive a data signal. The first data line DL1 to the sixth data line DL6 may be electrically connected to the first input line IL1 to the sixth input line IL6, respectively, and may be configured to transmit data signals to the pixels P at (e.g., in or on) the display area DA.

In FIGS. 2 and 3, six input lines IL1 to IL6 and six data lines DL1 to DL6 are illustrated for convenience of illustration. However, the present disclosure is not limited thereto, and the number of input lines and the number of data lines may be greater than six.

The first input line IL1 to the sixth input line IL6 may be sequentially arranged from an edge (e.g., in a direction toward the first peripheral area PA1) of the second peripheral area PA2 toward the center of the second peripheral area PA2 in a direction (e.g., a +x direction).

In an embodiment, the first input line IL1, the third input line IL3, and the fifth input line IL5, which are the oddnumbered input lines, may be electrically connected to the first data line DL1, the third data line DL3, and the fifth data line DL5, respectively, which are continuously arranged (e.g., in the x-axis direction) to be adjacent to each other. Each of the first input line IL1, the third input line IL3, and the fifth input line IL5 may be formed integrally with a corresponding one of the first data line DL1, the third data line DL3, and the fifth data line DL5. As shown in FIGS. 2 and 3, each of the first input line IL1, the third input line IL3, and the fifth input line IL5 may be electrically connected to a corresponding one of the first data line DL1, the third data line DL3, and the fifth data line DL5, through a corresponding first contact hole CNT1. For example, as shown in FIG. 3, the first data line DL1, the third data line DL3, and the fifth data line DL5 may be located on an insulating layer covering the first input line IL1, the third input line IL3, and the fifth input line IL5. The first data line DL1, the third data line DL3, and the fifth data line DL5 may be configured to receive data signals from the first input line IL1, the third input line IL3, and the fifth input line IL5, respectively.

As shown in FIG. 2, the second data line DL2, the fourth data line DL4, and the sixth data line DL6 may be continuously arranged to be adjacent to each other. The second input line IL2, the fourth input line IL4, and the sixth input line IL6, which are the even-numbered input lines, may be electrically connected to the second data line DL2, the fourth data line DL4, and the sixth data line DL6 through a first data transmission line DTL1, a second data transmission line DTL2, and a third data transmission line DTL3, respectively. In other words, the second input line IL2, the fourth input line IL4, and the sixth input line IL6 may be configured to transmit data signals to the second data line DL2, the fourth data line DL4, and the sixth data line DL6, respectively, through the first data transmission line DTL1, the second data transmission line DTL2, and the third data transmission line DTL3.

The first data transmission line DTL1 to the third data transmission line DTL3 may be arranged to pass through a portion of the display area DA adjacent to the peripheral area PA, or in other words, to pass through the display area DA. The second input line IL2 may be electrically connected to the second data line DL2 through the first data transmission line DTL1. The fourth input line IL4 may be electrically connected to the fourth data line DL4 through the second data transmission line DTL2. the sixth input line IL6 may be electrically connected to the sixth data line DL6 through the third data transmission line DTL3.

One end of the first data transmission line DTL1, one end of the second data transmission line DTL2, and one end of the third data transmission line DTL3 may be electrically connected to the second input line IL2, the fourth input line IL4, and the sixth input line IL6, respectively, through second contact holes CNT2. The other end of the first data transmission line DTL1, the other end of the second data transmission line DTL2, and the other end of the third data transmission line DTL3 may be electrically connected to the second data line DL2, the fourth data line DL4, and the sixth data line DL6, respectively. Although it is illustrated in FIGS. 2 and 3 that the second contact hole CNT2 is located at (e.g., in or on) the second peripheral area PA2, the present disclosure is not limited thereto. For example, the second contact hole CNT2 may be located at (e.g., in or on) the display area DA.

Accordingly, the second input line IL2 may transmit a data signal to the second data line DL2, the fourth input line IL4 may transmit a data signal to the fourth data line DL4, and the sixth input line IL6 may transmit a data signal to the sixth data line DL6.

FIG. 3 illustrates configurations of the first data transmission line DTL1, the second data transmission line DTL2, and the third data transmission line DTL3 of FIG. 2 in more detail.

As described above, the second input line IL2, the fourth input line IL4, and the sixth input line IL6 may be electrically connected to the second data line DL2, the fourth data line DL4, and the sixth data line DL6 through the first data transmission line DTL1, the second data transmission line DTL2, and the third data transmission line DTL3, respectively. In this case, the first data transmission line DTL1 may include a first vertical connection line DV1', a first horizontal connection line DH1, and a first additional vertical connection line DV1. Similarly, the second data transmission line DTL2 may include a second vertical connection line DV2', a second horizontal connection line DH2, and a second additional vertical connection line DV2. The third data transmission line DTL3 may include a third vertical connection line DV3', a third horizontal connection line DH3, and a third additional vertical connection line DV3.

The first vertical connection line DV1' to the third vertical connection line DV3' and the first additional vertical connection line DV1 to the third additional vertical connection line DV3 may be arranged to be parallel to or substantially parallel to the first data line DL1 to the sixth data line DL6. The first horizontal connection line DH1 to the third horizontal connection line DH3 may have shapes extending in the first direction (e.g., the x-axis direction) crossing the second direction (e.g., the y-axis direction) in which the first data line DL1 to the sixth data line DL6 extend.

Each of the second input line IL2, the fourth input line IL4, and the sixth input line IL6 may be electrically connected to a corresponding one of the first additional vertical connection line DV1, the second additional vertical connection line DV2, and the third additional vertical connection line DV3 through a corresponding second contact hole CNT2. Each of the first horizontal connection line DH1, the second horizontal connection line DH2, and the third horizontal connection line DH3 may be electrically connected to a corresponding one of the first additional vertical connection line DV1, the second additional vertical connection line DV2, and the third additional vertical connection line DV3 through a corresponding first connection contact hole DH-CNT1 defined at one end thereof. The first connection contact hole DH-CNT1 may be located at (e.g., in or on) the display area DA. Each of the first horizontal connection line DH1, the second horizontal connection line DH2, and the third horizontal connection line DH3 may be electrically connected to a corresponding one of the first vertical connection line DV1', the second vertical connection line DV2', and the third vertical connection line DV3' through a corresponding second connection contact hole DH-CNT2 defined at the other end thereof. The second connection contact hole DH-CNT2 may be located at (e.g., in or on) the display area DA.

Each of the first vertical connection line DV1', the second vertical connection line DV2', and the third vertical connection line DV3' may be electrically connected to a corresponding one of the second data line DL2, the fourth data line DL4, and the sixth data line DL6. In more detail, each of the first vertical connection line DV1', the second vertical connection line DV2', and the third vertical connection line DV3' may be electrically connected to a corresponding one of the second data line DL2, the fourth data line DL4, and the sixth data line DL6 at (e.g., in or on) the peripheral area PA outside the display area DA, or more specifically, at (e.g., in or on) the first peripheral area PA1. FIG. 3 illustrates an example in which each of the first vertical connection line DV1', the second vertical connection line DV2', and the third vertical connection line DV3' is integrated to form an integral single body with a corresponding one of the second data line DL2, the fourth data line DL4, and the sixth data line DL6 to be connected thereto at (e.g., in or on) the first peripheral area PA1.

The first data line DL1 to the sixth data line DL6, the first vertical connection line DV1' to the third vertical connection line DV3', and the first additional vertical connection line DV1 to the third additional vertical connection line DV3 may be located at (e.g., in or on) the same layer as each other. The first horizontal connection line DH1 to the third horizontal connection line DH3 may be located at (e.g., in or on) a different layer from that of the first data line DL1 to the sixth data line DL6. FIG. 3 illustrates an example in which the first data line DL1 to the sixth data line DL6 are located on an insulating layer covering the first horizontal connection line DH1 to the third horizontal connection line DH3. When certain components (e.g., similar or like components) are referred to as being located at (e.g., in or on) the same layer as each other, the components may be concurrently (e.g., simultaneously or substantially simultaneously) formed with each other of the same material through the same mask process. In this case, the components include the same material as each other.

When viewed in a direction (e.g., the z-axis direction) perpendicular to or substantially perpendicular to the substrate 100 (e.g., in a plan view), the first horizontal connection line DH1 may cross the first data line DL1, the second horizontal connection line DH2 may cross the first data line DL1 to the third data line DL3, and the third horizontal connection line DH3 may cross the first data line DL1 to the fifth data line DL5. Therefore, as described above, the first horizontal connection line DH1 to the third horizontal connection line DH3 may be located below the first data line DL1 to the sixth data line DL6, in order to not contact the data lines crossed by the first horizontal connection line DH1 to the third horizontal connection line DH3.

As shown in FIG. 3, the display apparatus according to the present embodiment may further include dummy lines.

As shown in FIG. 3, the display apparatus according to the present embodiment may include a first auxiliary horizontal connection line ADH1 that is spaced from the first horizontal connection line DH1. The first auxiliary horizontal connection line ADH1 is electrically insulated from the first horizontal connection line DH1 and the second data line DL2, and has an extension axis that is the same or substantially the same as the extension axis of the first horizontal connection line DH1. In more detail, the display apparatus may include the first auxiliary horizontal connection line ADH1 positioned on one side (e.g., in the −x direction) of the first horizontal connection line DH1, and the first auxiliary horizontal connection line ADH1 positioned on the other side (e.g., in the +x direction) of the first horizontal connection line DH1. Similarly, the display apparatus may include a second auxiliary horizontal connection line ADH2 positioned on one side (e.g., in the −x direction) of the second horizontal connection line DH2, and the second auxiliary horizontal connection line ADH2 positioned on the other side (e.g., in the +x direction) of the second horizontal connection line DH2. Similarly, a third auxiliary horizontal connection line ADH3 may positioned on one side (e.g., in the −x direction) of the third horizontal connection line DH3, and the third auxiliary horizontal connection line ADH3 may be positioned on the other side (e.g., in the +x direction) of the third horizontal connection line DH3. The first auxiliary horizontal connection line ADH1, the second auxiliary horizontal connection line ADH2, and the third auxiliary horizontal connection line ADH3 may be electrically insulated from the first horizontal connection line DH1, the second horizontal connection line DH2, and the third horizontal connection line DH3, and may also be electrically insulated from the data lines DL1 to DL6.

Accordingly, a structural difference between pixels through which the first horizontal connection line DH1 to the third horizontal connection line DH3 pass and pixels through which the first horizontal connection line DH1 to the third horizontal connection line DH3 do not pass may be reduced. As a result, when the same electrical signal is applied to the pixels, the difference in luminance implemented in the pixels may be reduced, thereby implementing a display apparatus that may display high quality images. The first auxiliary horizontal connection lines ADH1 to the third auxiliary horizontal connection line ADH3 and the first horizontal connection line DH1 to the third horizontal connection line DH3 may be located at (e.g., in or on) the same layer as each other.

Similarly, the display apparatus according to the present embodiment may include a first auxiliary vertical connection line ADV1' that is spaced apart from the first vertical connection line DV1'. The first auxiliary vertical connection line ADV1' is electrically insulated from the first vertical connection line DV1' and the first horizontal connection line DH1, and has an extension axis that is the same or substantially the same as the extension axis of the first vertical connection line DV1'. The first auxiliary vertical connection line ADV1' is located on one side (e.g., in the +y direction) of the first vertical connection line DV1'. Also, the display apparatus may include a second auxiliary vertical connection line ADV2' positioned on one side (e.g., in the +y direction) of the second vertical connection line DV2', and a third auxiliary vertical connection line ADV3' positioned on one side (e.g., in the +y direction) of the third vertical connection line DV3'. The first auxiliary vertical connection line ADV1' to the third auxiliary vertical connection line ADV3' and the first vertical connection line DV1' to the third vertical connection line DV3' may be located at (e.g., in or on) the same layer as each other.

In addition, the display apparatus according to the present embodiment may include a first auxiliary additional vertical connection line ADV1 that is spaced apart from the first additional vertical connection line DV1, and is electrically insulated from the first additional vertical connection line DV1 and the first horizontal connection line DH1. The first auxiliary additional vertical connection line ADV1 has an extension axis that is the same or substantially the same as the extension axis of the first additional vertical connection line DV1, and is located on one side (e.g., in the +y direction) of the first additional vertical connection line DV1. Also, the display apparatus may include a second auxiliary additional vertical connection line ADV2 positioned on one side (e.g., in the +y direction) of the second additional vertical connection line DV2, and a third auxiliary additional vertical connection line ADV3 positioned on one side (e.g., in the +y direction) of the third additional vertical connection line DV3. The first auxiliary additional vertical connection line ADV1 to the third auxiliary additional vertical connection line ADV3 and the first additional vertical connection line DV1 to the third additional vertical connection line DV3 may be located at (e.g., in or on) the same layer as each other.

Accordingly, a structural difference between pixels through which the first vertical connection line DV1' to the third vertical connection line DV3' pass and pixels through which the first vertical connection line DV1' to the third vertical connection line DV3' do not pass may be reduced. In addition, a structural difference between pixels through which the first additional vertical connection lines DV1 to the third additional vertical connection line DV3 pass and pixels through which the first additional vertical connection line DV1 to the third additional vertical connection line DV3 do not pass may be reduced. As a result, when the same electrical signal is applied to the pixels, the difference in luminance implemented in the pixels may be reduced, thereby implementing a display apparatus that may display high quality images.

As shown in FIG. 3, a fourth horizontal connection line DH4 may be located in a direction (e.g., the +y direction) toward the center of the display area DA from the third horizontal connection line DH3. The fourth horizontal connection line DH4 may also have a shape extending in the first direction (e.g., the x-axis direction), like that of the third horizontal connection line DH3. The fourth horizontal connection line DH4 may extend from the first peripheral area PA1 on one side (e.g., in the −x direction) of the display area DA to the first peripheral area PA1 on the other side (e.g., in the +x direction) of the display area DA. The fourth horizontal connection line DH4 may not be electrically connected to the data lines. The display apparatus may include a plurality of fourth horizontal connection lines DH4. When the fourth horizontal connection line DH4 is included, a structural difference between pixels through which the third horizontal connection line DH3 and the like pass and pixels located in the center of the display area DA may be reduced. Both ends of each of the fourth horizontal connection lines DH4, which are not electrically connected to the data lines, may be electrically connected to, for example, the second power supply line 16. Accordingly, the second power voltage (e.g., the common voltage) ELVSS may be transmitted uniformly or substantially uniformly to the opposite electrode 230 throughout the display area DA.

Figure 4:
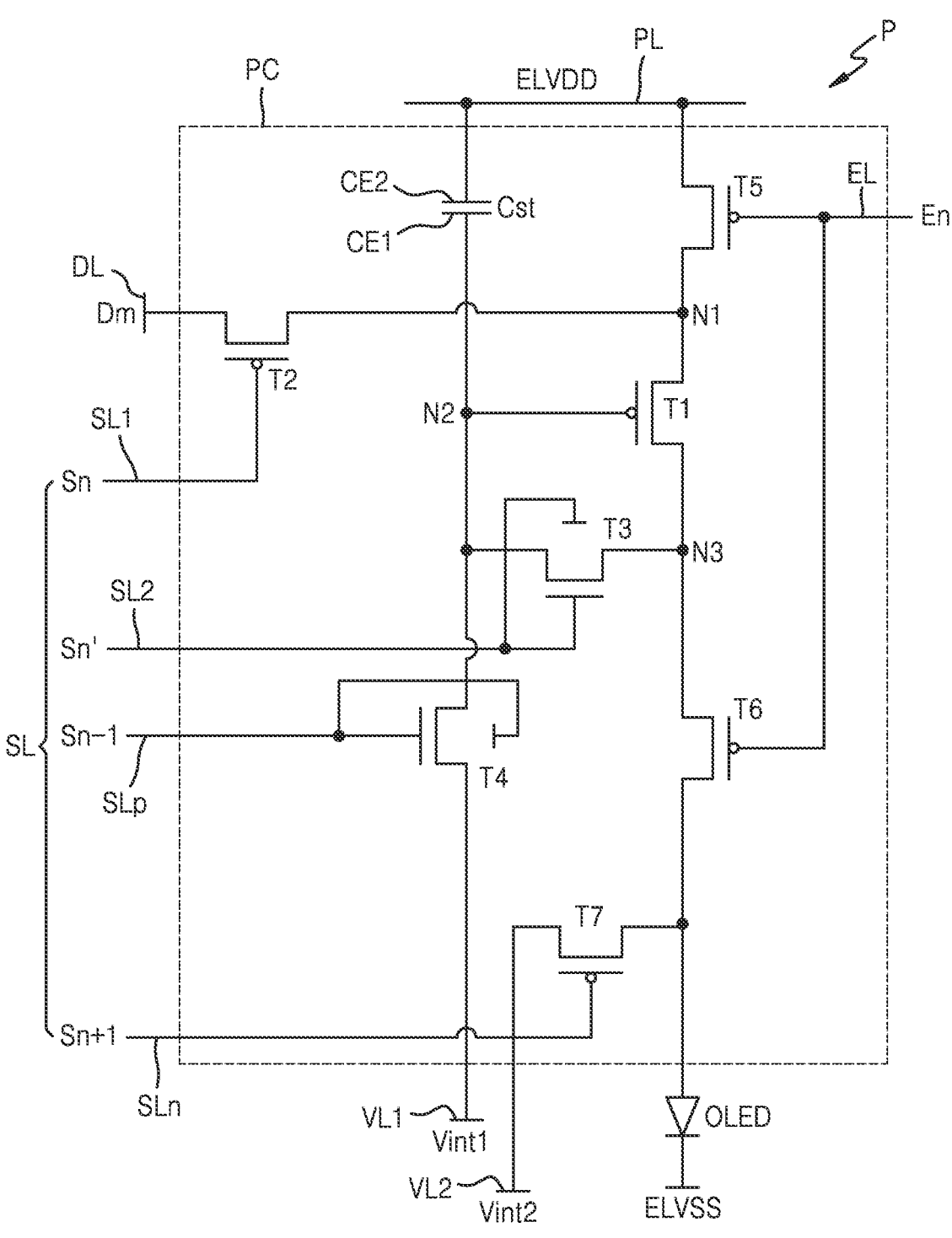
FIG. 4 is an equivalent circuit diagram of a pixel included in the display apparatus of FIG. 1.

FIG. 4 is an equivalent circuit diagram of a pixel P included in the display apparatus of FIG. 1. As shown in FIG. 4, the pixel P may include a pixel circuit PC, and an organic light-emitting diode OLED electrically connected to the pixel circuit PC.

The pixel circuit PC may include a plurality of thin-film transistors T1 to T7 and a storage capacitor Cst, as shown in FIG. 4. The plurality of thin-film transistors T1 to T7 and the storage capacitor Cst may be connected to signal lines SL1, SL2, SLp, SLn, EL, and DL, a first initialization voltage line VL1, a second initialization voltage line VL2, and a driving voltage line PL. At least any one of these lines, for example, such as the driving voltage line PL, may be shared by neighboring (e.g., adjacent) pixels P.

The plurality of thin-film transistors T1 to T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a first electrode (e.g., a pixel electrode) and a second electrode (e.g., an opposite electrode 230). The first electrode may be connected to the driving transistor T1 via the emission control transistor T6, and may receive a driving current. The second electrode may receive a second power voltage ELVSS. The organic light-emitting diode OLED may generate light having a desired luminance corresponding to the driving current.

Some of the plurality of thin-film transistors T1 to T7 may be n-channel metal-oxide-semiconductor field-effect-transistors (n-channel MOSFETs or NMOS), and the other ones may be p-channel MOSFETs (PMOS). For example, the compensation transistor T3 and the first initialization transistor T4 from among the plurality of thin-film transistors T1 to T7 may be NMOS, and the other remaining transistors may be PMOS. In some embodiments, the compensation transistor T3, the first initialization transistor T4, and the second initialization transistor T7 from among the plurality of thin-film transistors T1 to T7 may be NMOS, and the other remaining transistors may be PMOS. In some embodiments, the plurality of thin-film transistors T1 to T7 may all be NMOS, or may all be PMOS. Each of the plurality of thin-film transistors T1 to T7 may include amorphous silicon or polysilicon. In some embodiments, a thin-film transistor implemented as an NMOS may include an oxide semiconductor. Hereinafter, for convenience, the compensation transistor T3 and the first initialization transistor T4 may be described in the context of NMOS transistors including an oxide semiconductor, and the other transistors may be described in the context of PMOS transistors.

The signal lines may include a first scan line SL1 configured to transmit a first scan signal Sn to the switching transistor T2, a second scan line SL2 configured to transmit a second scan signal Sn' to the compensation transistor T3, a previous scan line SLp configured to transmit a previous scan signal Sn−1 to the first initialization transistor T4, a next scan line SLn configured to transmit a next scan signal Sn+1 to the second initialization transistor T7, an emission control line EL configured to transmit an emission control signal En to the operation control transistor T5 and the emission control transistor T6, and a data line DL that crosses the first scan line SL1, and is configured to transmit a data signal Dm to the switching transistor T2.

The driving voltage line PL may be configured to transmit the driving voltage ELVDD to the driving transistor T1. The first initialization voltage line VL1 may be configured to transmit a first initialization voltage Vint1 to the first initialization transistor T4 for initializing the driving transistor T1. The second initialization voltage line VL2 may be configured to transmit a second initialization voltage Vint2 to the second initialization transistor T7 for initializing the first electrode of the organic light-emitting diode OLED.

A driving gate electrode of the driving transistor T1 may be connected to the storage capacitor Cst via a second node N2. Any suitable one of a source region and a drain region of the driving transistor T1 may be connected to the driving voltage line PL via the operation control transistor T5 and a first node N1. The other one of the source region and the drain region of the driving transistor T1 may be electrically connected to the first electrode (e.g., the pixel electrode) of the organic light-emitting diode OLED via the emission control transistor T6 and a third node N3. The driving transistor T1 may receive the data signal Dm according to a switching operation of the switching transistor T2, and may supply a driving current to the organic light-emitting diode OLED. In other words, the driving transistor T1 may control an amount of current that flows to the organic light-emitting diode OLED from the first node N1 electrically connected to the driving voltage line PL, in response to a voltage applied to the second node N2 that varies according to the data signal Dm.

A switching gate electrode of the switching transistor T2 may be connected to the first scan line SL1 configured to transmit the first scan signal Sn to the switching transistor T2. Any suitable one of a source region and a drain region of the switching transistor T2 may be connected to the data line DL. The other one of the source region and the drain region of the switching transistor T2 may be connected to the driving voltage line PL via the operation control transistor T5 and the first node N1, to the driving transistor T1 via the first node N1. In response to a voltage applied to the first scan line SL1, the switching transistor T2 may be configured to transmit the data signal Dm from the data line DL to the first node N1. In other words, the switching transistor T2 may be turned on in response to the first scan signal Sn via the first scan line SL1, and perform a switching operation for transmitting the data signal Dm received via the data line DL to the driving transistor T1 via the first node N1.

A compensation gate electrode of the compensation transistor T3 may be connected to the second scan line SL2. Any suitable one of a source region and a drain region of the compensation transistor T3 may be connected to the first electrode of the organic light-emitting diode OLED via the emission control transistor T6 and the third node N3. The other one of the source region and the drain region of the compensation transistor T3 may be connected to a first capacitor electrode CE1 of the storage capacitor Cst and the driving gate electrode of the driving transistor T1 via the second node N2. The compensation transistor T3 may be turned on in response to the second scan signal Sn' received via the second scan line SL2, and diode-connect the driving transistor T1.

A first initialization gate electrode of the first initialization transistor T4 may be connected to the previous scan line SLp. Any suitable one of a source region and a drain region of the first initialization transistor T4 may be connected to the first initialization voltage line VL1. The other one of the source region and the drain region of the first initialization transistor T4 may be connected to the first capacitor electrode CE1 of the storage capacitor Cst and the driving gate electrode of the driving transistor T1 via the second node N2. The first initialization transistor T4 may be configured to apply the first initialization voltage Vint1 to the second node N2 from the first initialization voltage line VL1, in response to a voltage applied to the previous scan line SLp. In other words, the first initialization transistor T4 may be turned on in response to the previous scan signal Sn−1 received via the previous scan line SLp, and perform an initialization operation for applying the first initialization voltage Vint1 to the driving gate electrode of the driving transistor T1 to initialize a voltage of the driving gate electrode of the driving transistor T1.

An operation control gate electrode of the operation control transistor T5 may be connected to the emission control line EL. Any suitable one of a source region and a drain region of the operation control transistor T5 may be connected to the driving voltage line PL, and the other one may be connected to the driving transistor T1 and the switching transistor T2 via the first node N1.

An emission control gate electrode of the emission control transistor T6 may be connected to the emission control line EL. Any suitable one of a source region and a drain region of the emission control transistor T6 may be connected to the driving transistor T1 and the compensation transistor T3 via the third node N3. The other one of the source region and the drain region of the emission control transistor T6 may be electrically connected to the first electrode (e.g., the pixel electrode) of the organic light-emitting diode OLED.

The operation control transistor T5 and the emission control transistor T6 may be concurrently (e.g., simultaneously or substantially simultaneously) turned on with each other in response to the emission control signal En received via the emission control line EL, so that the driving voltage ELVDD is applied to the organic light-emitting diode OLED and a driving current flows in the organic light-emitting diode OLED.

A second initialization gate electrode of the second initialization transistor T7 may be connected to the next scan line SLn. Any suitable one of a source region and a drain region of the second initialization transistor T7 may be connected to the first electrode (e.g., the pixel electrode) of the organic light-emitting diode OLED. The other one of the source region and the drain region of the second initialization transistor T7 may be connected to the second initialization voltage line VL2, and receive the second initialization voltage Vint2. The second initialization transistor T7 may be turned on in response to the next scan signal Sn+1 received via the next scan line SLn, so that the first electrode (e.g., the pixel electrode) of the organic light-emitting diode OLED is initialized. The next scan line SLn and the first scan line SL1 may be the same line. In this case, the corresponding scan line may be configured to transmit the same electrical signal with a time difference, and may function as the first scan line SL1 and also as the next scan line SLn. In other words, the next scan line SLn may include a first scan line of a pixel that is adjacent to the pixel P shown in FIG. 4, and electrically connected to the data line (e.g., the same data line) DL.

The second initialization transistor T7 may be connected to the next scan line SLn, as shown in FIG. 4. However, the present disclosure is not limited thereto, and the second initialization transistor T7 may be connected to the emission control line EL and driven according to the emission control signal En.

The storage capacitor Cst may include the first capacitor electrode CE1 and a second capacitor electrode CE2. The first capacitor electrode CE1 of the storage capacitor Cst may be connected to the driving gate electrode of the driving transistor T1 via the second node N2. The second capacitor electrode CE2 of the storage capacitor Cst may be connected to the driving voltage line PL. The storage capacitor Cst may store a charge corresponding to a voltage difference between the driving gate electrode voltage of the driving transistor T1 and the driving voltage ELVDD.

An operation of the pixel P according to an embodiment is described in more detail below.

During an initialization period, when the previous scan signal Sn−1 is transmitted via the previous scan line SLp to the first initialization transistor T4, the first initialization transistor T4 may be turned on in response to the previous scan signal Sn-1, and the driving transistor T1 may be initialized according to the first initialization voltage Vint1 applied via the first initialization voltage line VL1.

During a data programming period, when the first scan signal Sn and the second scan signal Sn' are transmitted via the first scan line SL1 and the second scan line SL2, respectively, the switching transistor T2 and the compensation transistor T3 may be turned on in response to the first scan signal Sn and the second scan signal Sn'. In this case, the driving transistor T1 may be diode-connected by the compensation transistor T3 that is turned on, and may be biased in a forward direction. Then, a compensation voltage (e.g., Dm+Vth, where Vth has a negative value), which is obtained by subtracting the data signal Dm received via the data line DL by a threshold voltage Vth of the driving transistor T1, may be applied to the driving gate electrode of the driving transistor T1. The driving voltage ELVDD and the compensation voltage (Dm+Vth) are applied to opposite ends of the storage capacitor Cst, respectively, and a charge corresponding to a voltage difference between the opposite ends of the storage capacitor Cst may be stored in the storage capacitor Cst.

During an emission period, the operation control transistor T5 and the emission control transistor T6 may be turned on in response to the emission control signal En received via the emission control line EL. A driving current corresponding to a voltage difference between the voltage of the driving gate electrode of the driving transistor T1 and the driving voltage ELVDD may be generated, and the driving current may be supplied to the organic light-emitting diode OLED via the emission control transistor T6.

As described above, some of the plurality of thin-film transistors T1 to T7 may include an oxide semiconductor. For example, the compensation transistor T3 and the first initialization transistor T4 may include an oxide semiconductor.

In the case of polysilicon, which is highly reliable, an intended current may be precisely controlled to flow. Accordingly, when a semiconductor layer including the highly-reliable polysilicon is included in the driving transistor T1 that directly affects a brightness of the display apparatus, a high-resolution display apparatus may be implemented. In addition, an oxide semiconductor has high carrier mobility and low leakage current, and thus, a voltage drop may not be large even when a driving time is long. In other words, in an oxide semiconductor, a change in a color of an image according to a voltage drop may not be large even when the display apparatus is driven at low frequencies, and thus, the display apparatus may be driven at low frequencies. Accordingly, when the compensation transistor T3 and the first initialization transistor T4 include an oxide semiconductor, a display apparatus having reduced power consumption may be implemented, while preventing or substantially preventing a leakage current.

However, an oxide semiconductor may be sensitive to light, and thus, an amount of current or the like may vary depending on external light. Accordingly, a metal layer may be disposed under (e.g., underneath) the oxide semiconductor to absorb or reflect the external light. Accordingly, as shown in FIG. 4, in each of the compensation transistor T3 and the first initialization transistor T4 including the oxide semiconductor, a gate electrode may be located over and under an oxide semiconductor layer. In other words, when viewed in the direction (e.g., the z-axis direction) perpendicular to or substantially perpendicular to the upper surface of the substrate 100 (e.g., in a plan view), the metal layer disposed under (e.g., underneath) the oxide semiconductor may overlap with the oxide semiconductor.

Figure 5:
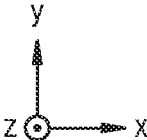
FIG. 5 is a layout diagram schematically illustrating positions of transistors, capacitors, and the like in the pixels included in the display apparatus of FIG. 1.
Figure 6:
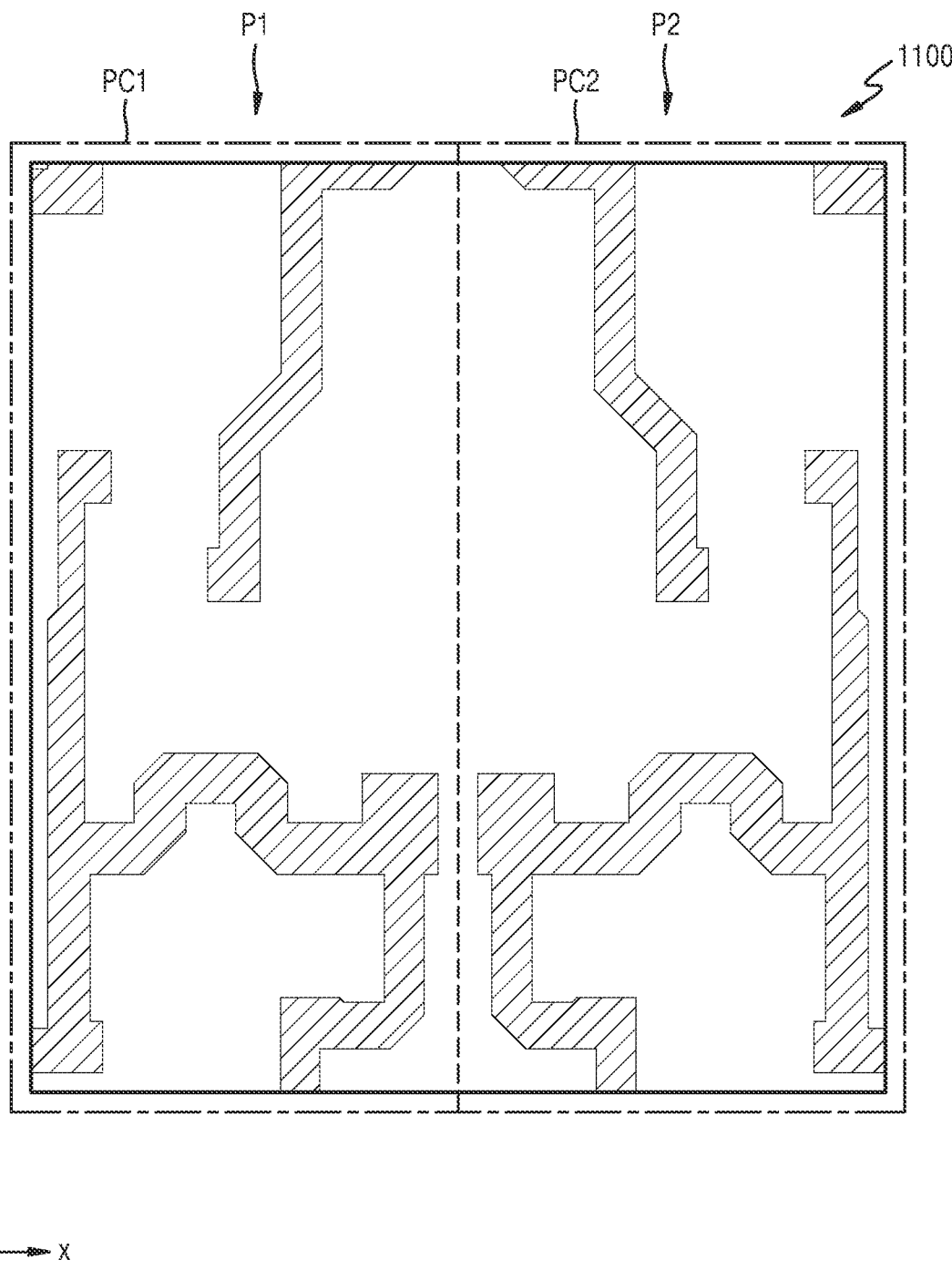
FIGS. 6-13 are layout diagrams schematically illustrating elements, such as the transistors and the capacitors, for each layer of the display apparatus shown in FIG. 5.

FIG. 5 is a layout diagram schematically illustrating positions of transistors, capacitors, and the like in the pixels included in the display apparatus in FIG. 1. FIGS. 6 through 13 are layout diagrams schematically illustrating elements, such as the transistors and the capacitors, for each layer of the display apparatus shown in FIG. 5. FIG. 14 is a cross-sectional view schematically illustrating cross-sections taken along the lines I-I', II-II', and III-III' of the display apparatus of FIG. 5.

Referring to FIGS. 5 through 14, the display apparatus may include a first pixel P1 and a second pixel P2 that are adjacent to each other. The first pixel P1 and the second pixel P2 may be symmetrical or substantially symmetrical to each other with respect to a virtual line, for example, as shown in FIG. 5 and the like. However, the present disclosure is not limited thereto, and in some embodiments, the first pixel P1 and the second pixel P2 may have the same or substantially the same structure as each other, rather than a symmetrical structure. The first pixel P1 may include a first pixel circuit PC1, and the second pixel P2 may include a second pixel circuit PC2. Hereinafter, for convenience, some conductive patterns are described based on the first pixel circuit PC1, and these conductive patterns may also be symmetrically or substantially symmetrically arranged in the second pixel circuit PC2.

For reference, the structure shown in FIGS. 5 through 13 may be repeated in the first direction (e.g., the x-axis direction), and may also be repeated in the second direction (e.g., the y-axis direction).

A buffer layer 111 (e.g., see FIG. 14) may be disposed on the substrate 100. The buffer layer 111 may include silicon oxide, silicon nitride, or silicon oxynitride. The buffer layer 111 may prevent or substantially prevent a phenomenon in which metal atoms and/or impurities from the substrate 100 diffuse to a first semiconductor layer 1100 that is disposed over the substrate 100. In addition, during a crystallization process of forming the first semiconductor layer 1100, the buffer layer 111 may adjust a rate at which heat is provided, so that the first semiconductor layer 1100 is uniformly or substantially uniformly crystallized.

As shown in FIG. 14, the first semiconductor layer 1100 may be disposed on the buffer layer 111. The first semiconductor layer 1100 may include a silicon semiconductor. For example, the first semiconductor layer 1100 may include amorphous silicon or polysilicon. For example, the first semiconductor layer 1100 may include polysilicon that is crystallized at a low temperature. If necessary or desired, ions may be injected into at least a portion of the first semiconductor layer 1100.

Figure 7:
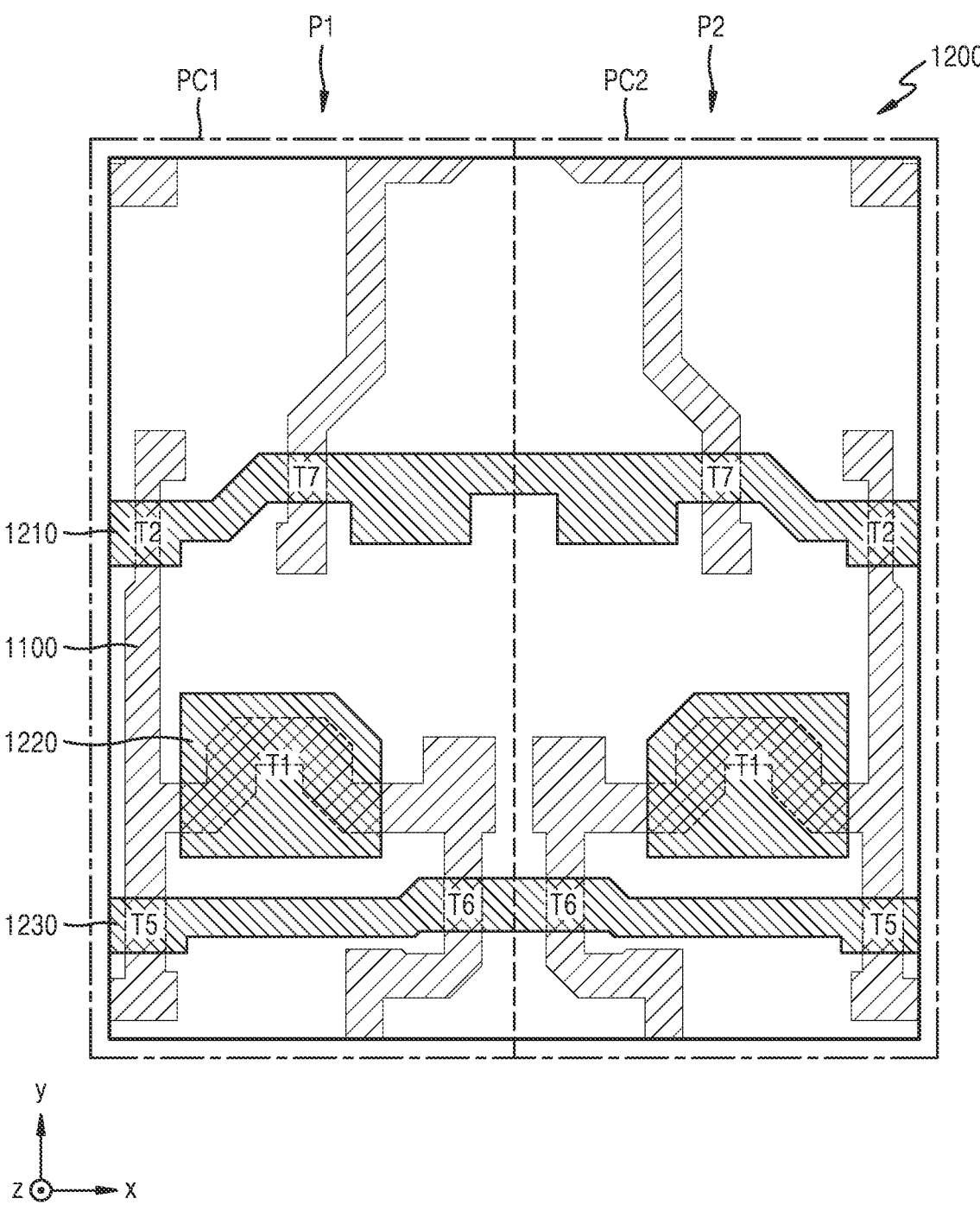

Because the driving transistor T1, the switching transistor T2, the operation control transistor T5, the emission control transistor T6, and the second initialization transistor T7 may be PMOS, as described above, these thin-film transistors may be located along the first semiconductor layer 1100, as shown in FIG. 7.

A first gate insulating layer 113 (e.g., see FIG. 14) may be disposed over the substrate 100, and may cover the first semiconductor layer 1100. The first gate insulating layer 113 may include an insulating material. For example, the first gate insulating layer 113 may include silicon oxide, silicon nitride, silicon oxynitride, aluminum oxide, or the like.

As shown in FIG. 7, a first gate layer 1200 may be disposed on the first gate insulating layer 113. In FIG. 7, the first semiconductor layer 1100 is shown together with the first gate layer 1200, for convenience of illustration. The first gate layer 1200 may include a first gate line 1210, a first gate electrode 1220, and a second gate line 1230.

The first gate line 1210 may extend in a first direction (e.g., the x-axis direction). The first gate line 1210 may be the first scan line SL1 or the next scan line SLn illustrated in FIG. 4. In other words, in the first pixel P1 shown in FIG. 7, the first gate line 1210 may correspond to the first scan line SL1 illustrated in FIG. 4, and in a pixel adjacent to the first pixel P1 in the +y direction, the first gate line 1210 may correspond to the next scan line SLn illustrated in FIG. 4. Accordingly, the first scan signal Sn and the next scan signal Sn+1 may be applied to the pixels via the first gate line 1210. Portions of the first gate line 1210 overlapping with the first semiconductor layer 1100 may include the switching gate electrode of the switching transistor T2 and the second initialization gate electrode of the second initialization transistor T7.

The first gate electrode 1220 may have an isolated (e.g., island) shape. The first gate electrode 1220 may include the driving gate electrode of the driving transistor T1. For reference, a portion of the first semiconductor layer 1100 overlapping with the first gate electrode 1220, and a portion therearound may be referred to as a driving semiconductor layer.

The second gate line 1230 may extend in the first direction (e.g., the x-axis direction). The second gate line 1230 may correspond to the emission control line EL illustrated in FIG. 4. Portions of the second gate line 1230 overlapping with the first semiconductor layer 1100 may include the operation control gate electrode of the operation control transistor T5 and the emission control gate electrode of the emission control transistor T6. The emission control signal En may be applied to the pixels via the second gate line 1230.

The first gate layer 1200 may include a metal, an alloy, a conductive metal oxide, a transparent conductive material, or the like. For example, the first gate layer 1200 may include silver (Ag), an Ag-containing alloy, molybdenum (Mo), a Mo-containing alloy, aluminum (Al), an Al-containing alloy, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), indium zinc oxide (IZO), or the like. The first gate layer 1200 may have a multi-layered structure, such as a two-layered structure of a Mo layer and an Al layer, or a three-layered structure of a Mo layer, an Al layer, and another Mo layer.

A second gate insulating layer 115 (e.g., see FIG. 14) may be disposed on the first gate insulating layer 113, and may cover the first gate layer 1200. The second gate insulating layer 115 may include the same/similar insulating material as that of the first gate insulating layer 113.

Figure 8:
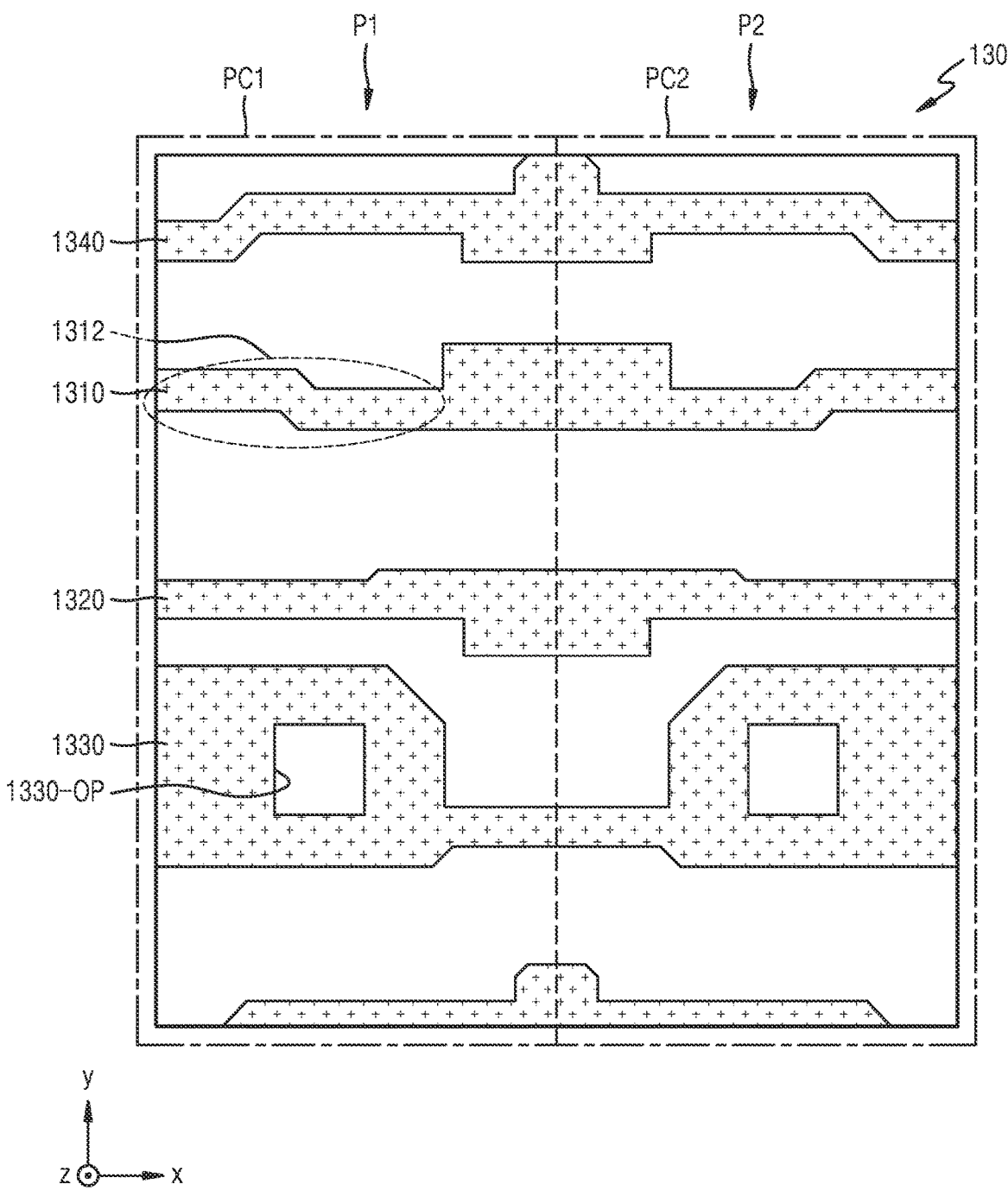

As shown in FIG. 8, a second gate layer 1300 may be disposed on the second gate insulating layer 115. The second gate layer 1300 may include a third gate line 1310, a fourth gate line 1320, a capacitor upper electrode 1330, and a first initialization voltage line 1340 (e.g., the first initialization voltage line VL1 illustrated in FIG. 4).

The third gate line 1310 may extend in the first direction (e.g., the x-axis direction). The third gate line 1310 may correspond to the previous scan line SLp illustrated in FIG. 4. When viewed in the direction (e.g., the z-axis direction) perpendicular to or substantially perpendicular to the substrate 100 (e.g., in a plan view), the third gate line 1310 may be spaced apart from the first gate line 1210. The previous scan signal Sn−1 may be applied to the pixels via the third gate line 1310. A portion of the third gate line 1310 overlapping with a second semiconductor layer 1400 described in more detail below may include a first initialization lower gate electrode of the first initialization transistor T4. In other words, the third gate line 1310 may be referred to as an initialization gate line.

The fourth gate line 1320 may also extend in the first direction (e.g., the x-axis direction). The fourth gate line 1320 may correspond to the second scan line SL2 illustrated in FIG. 4. When viewed in the direction (e.g., the z-axis direction) perpendicular to or substantially perpendicular to the substrate 100 (e.g., in a plan view), the fourth gate line 1320 may be spaced apart from the first gate line 1210 and the third gate line 1310. The second scan signal Sn' may be applied to the pixels via the fourth gate line 1320. A portion of the fourth gate line 1320 overlapping with the second semiconductor layer 1400 described in more detail below may include a compensation lower gate electrode of the compensation transistor T3.

The third gate line 1310 and the fourth gate line 1320 may be disposed under (e.g., underneath) the second semiconductor layer 1400 described in more detail below with reference to FIG. 9, and may function as gate electrodes as well as lower protective metals for protecting portions of the second semiconductor layer 1400 overlapping with the third gate line 1310 and the fourth gate line 1320.

The capacitor upper electrode 1330 may overlap with the first gate electrode 1220, and may extend in the first direction (e.g., the x-axis direction). The capacitor upper electrode 1330 as described above may correspond to the second capacitor electrode CE2 illustrated in FIG. 4 to constitute the storage capacitor Cst together with the first gate electrode 1220. The driving voltage ELVDD may be applied to the capacitor upper electrode 1330. In addition, a hole passing through (e.g., penetrating) the capacitor upper electrode 1330 may be defined in the capacitor upper electrode 1330, and at least a portion of the first gate electrode 1220 may overlap with the hole.

The first initialization voltage line 1340 corresponding to the first initialization voltage line VL1 illustrated in FIG. 4 may extend in the first direction (e.g., the x-axis direction). When viewed in the direction (e.g., the z-axis direction) perpendicular to or substantially perpendicular to the substrate 100 (e.g., in a plan view), the first initialization voltage line 1340 may be spaced apart from the third gate line 1310. The first initialization voltage Vint1 may be applied to the pixels via the first initialization voltage line 1340. The first initialization voltage line 1340 may at least partially overlap with the second semiconductor layer 1400 described in more detail below, and may be configured to apply the first initialization voltage Vint1 to the second semiconductor layer 1400. The first initialization voltage line 1340 may be electrically connected to the second semiconductor layer 1400 via contact holes 1680CNT1, 1680CNT2, and 1680CNT3 described in more detail below with reference to FIG. 11.

The second gate layer 1300 may include a metal, an alloy, a conductive metal oxide, a transparent conductive material, or the like. For example, the second gate layer 1300 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, or IZO. The second gate layer 1300 may have a multi-layered structure, such as a two-layered structure of a Mo layer and an Al layer, or a three-layered structure of a Mo layer, an Al layer, and another Mo layer.

A first interlayer insulating layer 117 (e.g., see FIG. 14) may be disposed on the second gate insulating layer 115, and may cover the second gate layer 1300. The first interlayer insulating layer 117 may include an insulating material. For example, the first interlayer insulating layer 117 may include silicon oxide, silicon nitride, silicon oxynitride, aluminum oxide, or the like.

Figure 9:
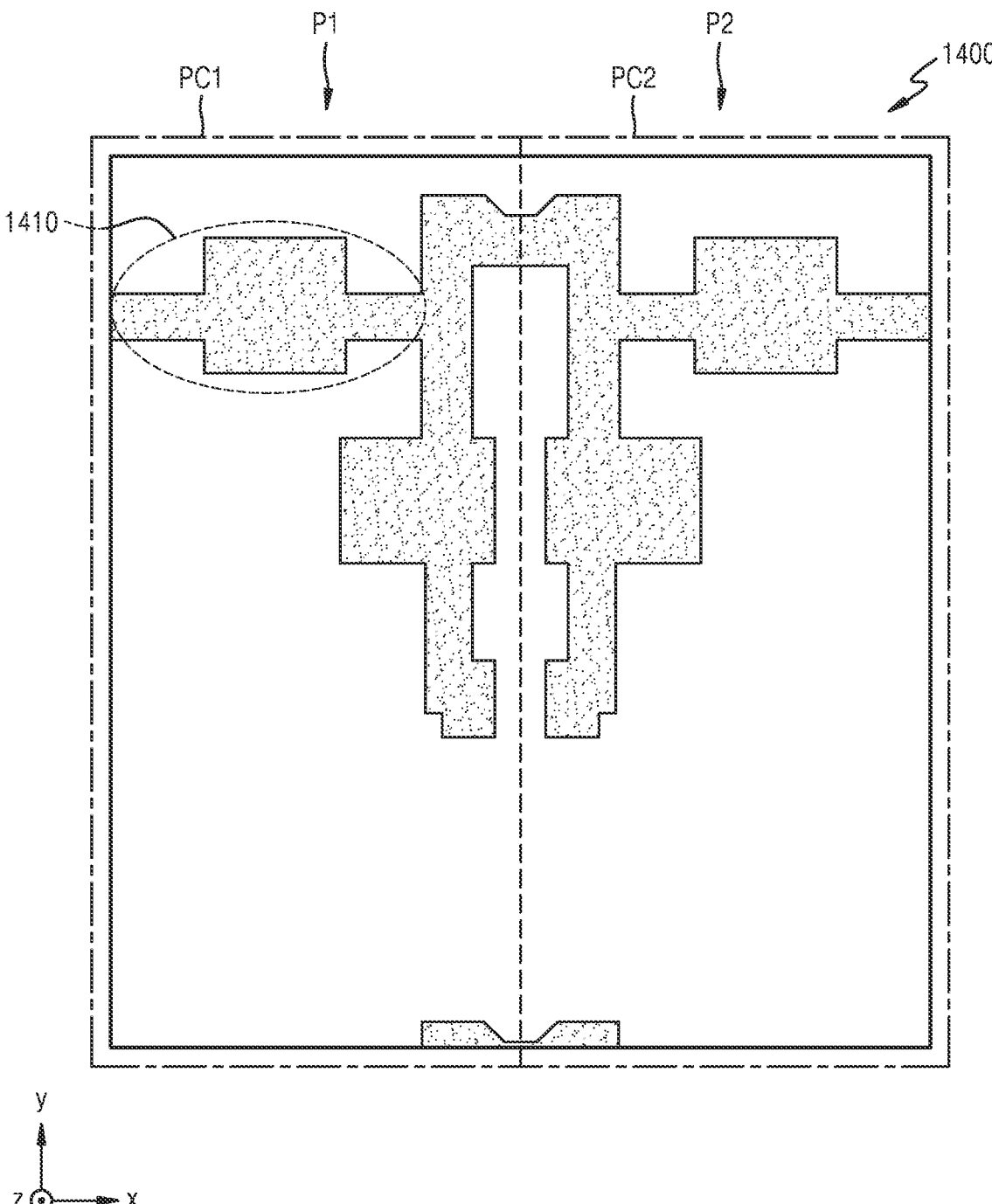

As shown in FIG. 9, the second semiconductor layer 1400 may be disposed on the first interlayer insulating layer 117. As described above, the second semiconductor layer 1400 may include an oxide semiconductor. The second semiconductor layer 1400 may be disposed on a layer different from a layer on which the first semiconductor layer 1100 is disposed, and may not overlap with the first semiconductor layer 1100 when viewed in the direction (e.g., the z-axis direction) perpendicular to or substantially perpendicular to the substrate 100 (e.g., in a plan view). The second semiconductor layer 1400 may include a shield layer 1410 to which a constant or substantially constant voltage is applied. The constant voltage applied to the shield layer 1410 and the function of the shield layer 1410 is described in more detail below.

As described above, the second semiconductor layer 1400 overlaps with the third gate line 1310, which is the initialization gate line, and thus, it may be understood that the second semiconductor layer 1400 includes an oxide semiconductor layer overlapping with the third gate line 1310, which is the initialization gate line. The oxide semiconductor layer may constitute the compensation transistor T3 and the first initialization transistor T4. The shield layer 1410 included in the second semiconductor layer 1400 may include the same or substantially the same material as that of the oxide semiconductor layer.

The second semiconductor layer 1400 may extend in the first direction (e.g., the x-axis direction) as a whole, as shown in FIG. 9, and may be integrally formed as a single body with respect to a plurality of pixels positioned along the first direction (e.g., the x-axis direction). Accordingly, the shield layer 1410 may be a portion of the second semiconductor layer 1400. In other words, the shield layer 1410 and the oxide semiconductor layer included in the second semiconductor layer 1400 and constituting the compensation transistor T3 and the first initialization transistor T4 may be integrally formed with each other as a single body. In addition, the shield layer 1410 may have a shape extending in the first direction (e.g., the x-axis direction). Accordingly, the shield layer 1410 may be integrally formed as a single body with respect to the pixels arranged along the first direction (e.g., the x-axis direction). In addition, the second semiconductor layer 1400 may also have a portion extending in the second direction (e.g., the y-axis direction) in each of the pixels.

A third gate insulating layer 118 (e.g., see FIG. 14) may be disposed on the first interlayer insulating layer 117, and may cover the second semiconductor layer 1400. The third gate insulating layer 118 may include an insulating material. However, as shown in FIG. 14, the third gate insulating layer 118 may be disposed on a portion of the second semiconductor layer 1400, and not entirely on the first interlayer insulating layer 117. For example, as shown in FIG. 14, the third gate insulating layer 118 may have the same or substantially the same pattern as that of a third gate layer 1500 described in more detail below with reference to FIG. 10. In other words, when viewed in the direction (e.g., the z-axis direction) perpendicular to or substantially perpendicular to the substrate 100 (e.g., in a plan view), the third gate insulating layer 118 may completely or almost completely overlap with the third gate layer 1500. In other words, the third gate insulating layer 118 and the third gate layer 1500 may be concurrently (e.g., simultaneously or substantially simultaneously) patterned with each other. Accordingly, in the second semiconductor layer 1400, source regions and drain regions may not be covered by the third gate insulating layer 118, and channel regions overlapping with the third gate layer 1500 may be covered by the third gate insulating layer 118. The source regions and the drain regions may be in direct contact with a second interlayer insulating layer 119 described in more detail below with reference to FIG. 14. The third gate insulating layer 118 may include silicon oxide, silicon nitride, silicon oxynitride, aluminum oxide, or the like.

Figure 10:
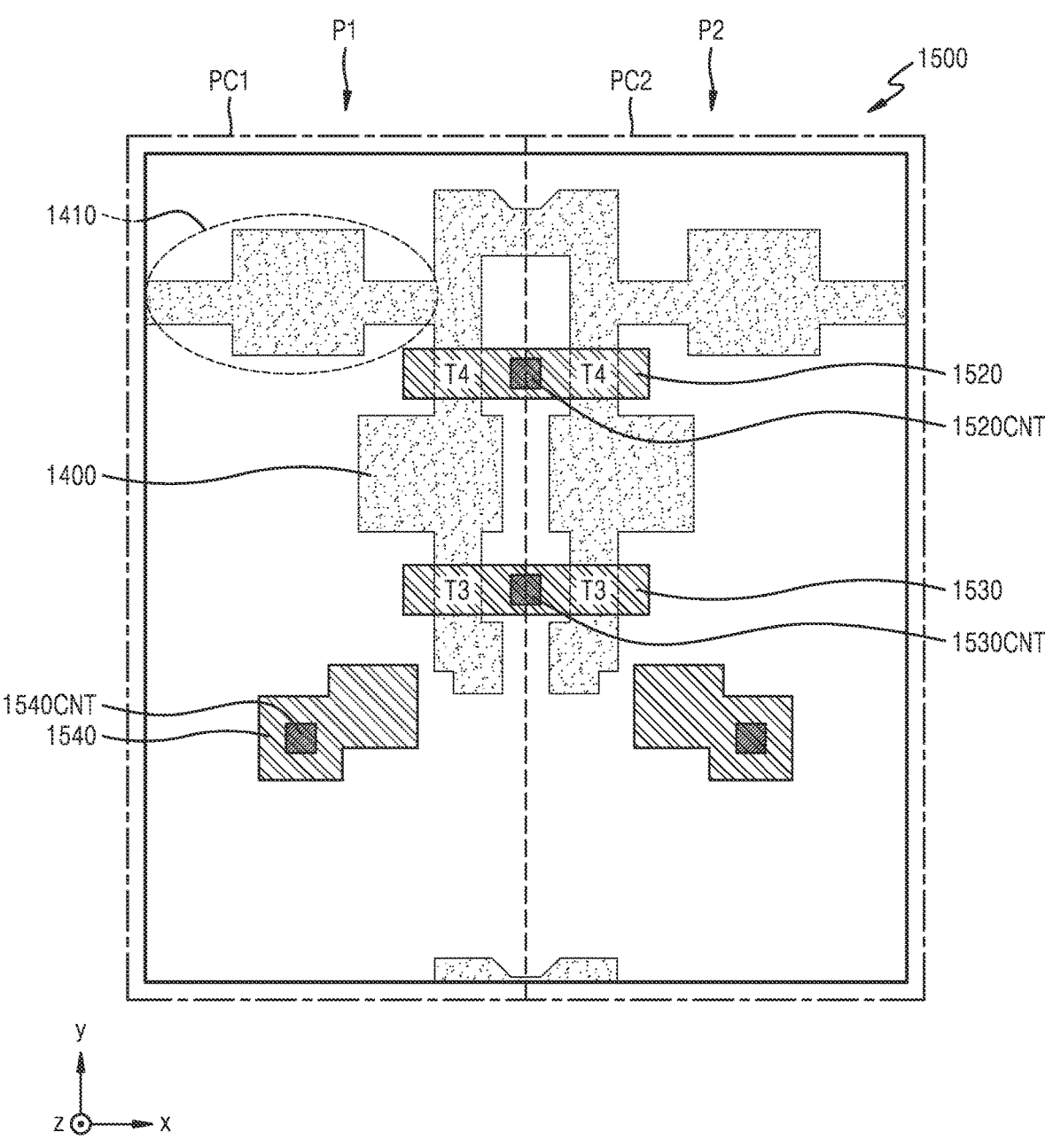

As shown in FIG. 10, the third gate layer 1500 may be disposed on the third gate insulating layer 118. The third gate layer 1500 may include a fifth gate line 1520, a sixth gate line 1530, and a first transmission line 1540.

The fifth gate line 1520 may extend in the first direction (e.g., the x-axis direction). When viewed in the direction (e.g., the z-axis direction) perpendicular to or substantially perpendicular to the substrate 100 (e.g., in a plan view), the fifth gate line 1520 may overlap with the third gate line 1310. As described above, because the second semiconductor layer 1400 also has a portion extending in the second direction (e.g., the y-axis direction) in each of the pixels, the third gate line 1310 and the fifth gate line 1520 may overlap with the portion of the second semiconductor layer 1400 extending in the second direction (e.g., the y-axis direction).

A portion of the fifth gate line 1520 overlapping with the second semiconductor layer 1400 may include a first initialization upper gate electrode of the first initialization transistor T4. A portion of the second semiconductor layer 1400 overlapping with the fifth gate line 1520 and a portion therearound may be referred to as a first initialization semiconductor layer. The fifth gate line 1520 may be electrically connected to the third gate line 1310. For example, the fifth gate line 1520 may be electrically connected to the third gate line 1310 via a contact hole 1520CNT defined in an insulating layer between the fifth gate line 1520 and the third gate line 1310.

Although FIG. 10 illustrates an example in which the fifth gate line 1520 extends in the first direction (e.g., the x-axis direction) and has an isolated (e.g., island) shape, the present disclosure is not limited thereto. For example, the fifth gate line 1520 may extend in the first direction (e.g., the x-axis direction) to cross the display area DA, and may be integrally formed as a single body with respect to a plurality of the pixels.

The sixth gate line 1530 may extend in the first direction (e.g., the x-axis direction). When viewed in the direction (e.g., the z-axis direction) perpendicular to or substantially perpendicular to the substrate 100 (e.g., in a plan view), the sixth gate line 1530 may overlap with the fourth gate line 1320. As described above, because the second semiconductor layer 1400 also has a portion extending in the second direction (e.g., the y-axis direction) in each of the pixels, the fourth gate line 1320 and the sixth gate line 1530 may overlap with the portion of the second semiconductor layer 1400 extending in the second direction (e.g., the y-axis direction).

A portion of the sixth gate line 1530 overlapping with the second semiconductor layer 1400 may include a compensation upper gate electrode of the compensation transistor T3. The sixth gate line 1530 may be electrically connected to the fourth gate line 1320. For example, the sixth gate line 1530 may be electrically connected to the fourth gate line 1320 via a contact hole 1530CNT defined in an insulating layer between the sixth gate line 1530 and the fourth gate line 1320.

Although FIG. 10 illustrates an example in which the sixth gate line 1530 extends in the first direction (e.g., the x-axis direction) and has an isolated (e.g., island) shape, the present disclosure is not limited thereto. For example, the sixth gate line 1530 may extend in the first direction (e.g., the x-axis direction) to cross the display area DA, and may be integrally formed as a single body with respect to a plurality of the pixels.

The first transmission line 1540 may be electrically connected to the first gate electrode 1220, which is a driving gate electrode, through a contact hole 1540CNT passing through an opening 1330-OP of the capacitor upper electrode 1330. The first transmission line 1540 may be configured to transmit the first initialization voltage Vint1 received via the first initialization transistor T4 to the first gate electrode 1220.

The third gate layer 1500 may include a metal, an alloy, a conductive metal oxide, a transparent conductive material, or the like. For example, the third gate layer 1500 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The third gate layer 1500 may have a multi-layered structure, such as a two-layered structure of a Mo layer and an Al layer, or a three-layered structure of a Mo layer, an Al layer, and another Mo layer.

The second interlayer insulating layer 119 (e.g., see FIG. 14) may cover at least a portion of the third gate layer 1500 illustrated in FIG. 10. The second interlayer insulating layer 119 may include an insulating material. For example, the second interlayer insulating layer 119 may include silicon oxide, silicon nitride, silicon oxynitride, aluminum oxide, or the like.

Figure 11:
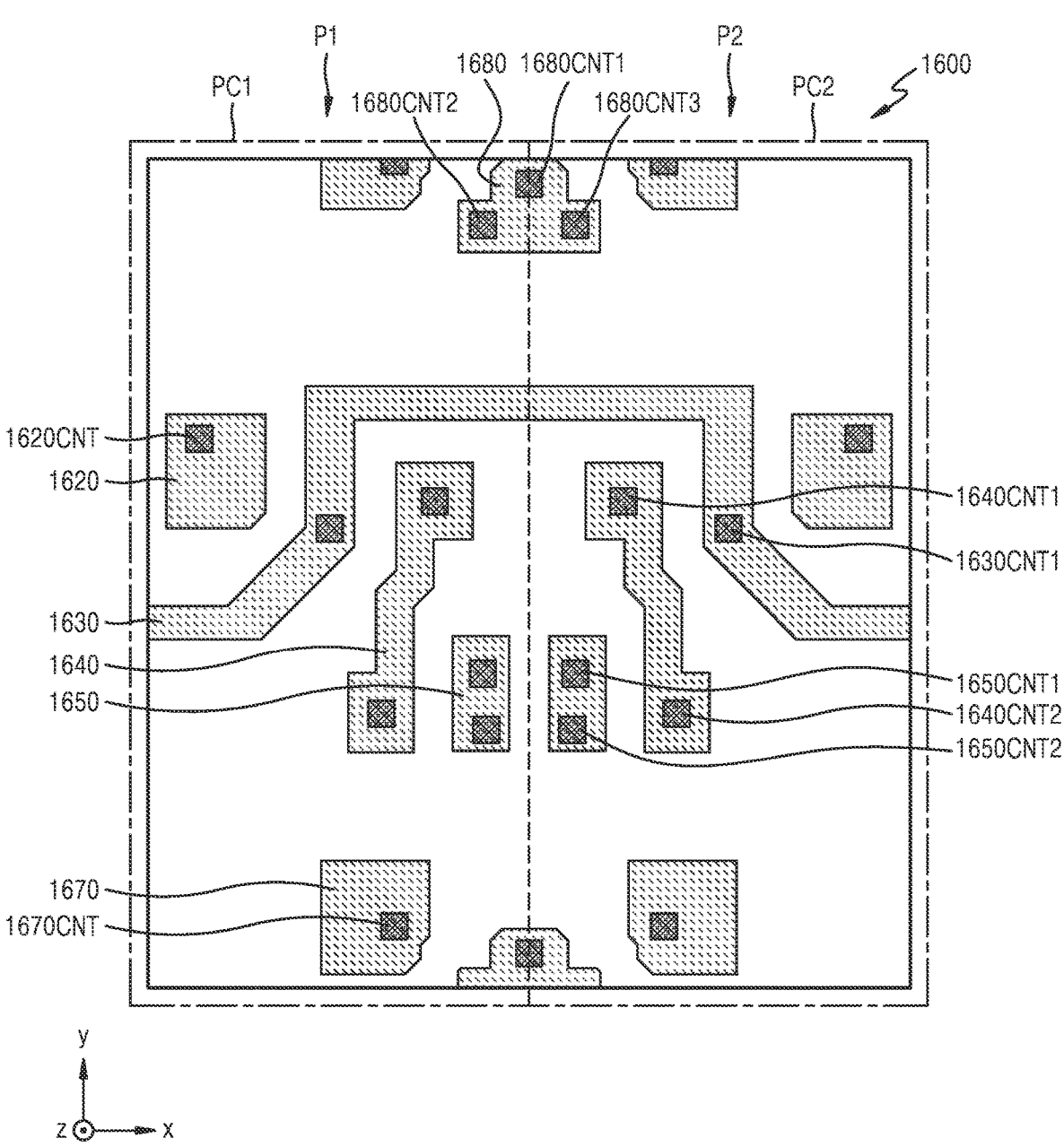

As shown in FIG. 11, a first connection electrode layer 1600 may be disposed on the second interlayer insulating layer 119. The first connection electrode layer 1600 may include a second transmission line 1620, a second initialization voltage line 1630, a third transmission line 1640, a fourth transmission line 1650, a fifth transmission line 1670, and a sixth transmission line 1680.

The second transmission line 1620 may be electrically connected to the first semiconductor layer 1100 via a contact hole 1620CNT. The data signal Dm from a data line 1810 described in more detail below with reference to FIG. 13 may be transmitted to the first semiconductor layer 1100 via the second transmission line 1620, and may be applied to the switching transistor T2.

The second initialization voltage line 1630 may extend in the first direction (e.g., the x-axis direction). The second initialization voltage line 1630, which corresponds to the second initialization voltage line VL2 illustrated in FIG. 4, may be configured to apply the second initialization voltage Vint2 to the pixels. The second initialization voltage line 1630 may be electrically connected to the first semiconductor layer 1100 via a contact hole 1630CNT1, so that the second initialization voltage Vint2 may be applied to the first semiconductor layer 1100 and the second initialization transistor T7.

The third transmission line 1640 may electrically connect the second semiconductor layer 1400 and the first transmission line 1540 to each other via contact holes 1640CNT1 and 1640CNT2 respectively defined at one side and the other side of the third transmission line 1640. The first transmission line 1540 may be electrically connected to the first gate electrode 1220, which is a driving gate electrode, and thus, the third transmission line 1640 may electrically connect the first initialization semiconductor, which is a portion of the second semiconductor layer 1400, to the driving gate electrode. The first initialization voltage Vint1 may be transmitted to the first gate electrode 1220, which is a driving gate electrode, through the second semiconductor layer 1400, the third transmission line 1640, and the first transmission line 1540.

The fourth transmission line 1650 may electrically connect the second semiconductor layer 1400 and the first semiconductor layer 1100 to each other via contact holes 1650CNT1 and 1650CNT2 respectively defined at one side and the other side of the fourth transmission line 1650. In other words, the fourth transmission line 1650 may electrically connect the compensation transistor T3 and the driving transistor T1 to each other.

The fifth transmission line 1670 may be electrically connected to the first semiconductor layer 1100 via a contact hole 1670CNT. The fifth transmission line 1670 may be configured to transmit the driving current or the second initialization voltage Vint2 from the first semiconductor layer 1100 to the organic light-emitting diode OLED.

The sixth transmission line 1680 may be electrically connected to the second semiconductor layer 1400 via contact holes 1680CNT2 and 1680CNT3. In addition, the sixth transmission line 1680 may be electrically connected to the first initialization voltage line 1340 illustrated in FIG. 8 via a contact hole 1680CNT1. Accordingly, the sixth transmission line 1680 may be configured to transmit the first initialization voltage Vint1 from the first initialization voltage line 1340 to the first initialization transistor T4. The sixth transmission line 1680 may be referred to as a connection electrode.

As described above, because the shield layer 1410 and the oxide semiconductor layer included in the second semiconductor layer 1400 are integrally formed with each other as a single body, the shield layer 1410 is electrically connected to the first initialization voltage line 1340 through the sixth transmission line 1680. Accordingly, the first initialization voltage Vint1 that is a constant or substantially constant voltage may be applied to the shield layer 1410. The sixth transmission line 1680 may be referred to as the connection electrode that electrically connects the shield layer 1410 and the first initialization voltage line 1340 to each other.

The first connection electrode layer 1600 may include a metal, an alloy, a conductive metal oxide, a transparent conductive material, or the like. For example, the first connection electrode layer 1600 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The first connection electrode layer 1600 may have a multi-layered structure, such as a two-layered structure of a Ti layer and an Al layer, or a three-layered structure of a Ti layer, an Al layer, and another Ti layer.

A first planarization insulating layer 121 (e.g., see FIG. 14) may be disposed on the second interlayer insulating layer 119, and may cover the first connection electrode layer 1600. The first planarization insulating layer 121 may include an organic insulating material. For example, the first planarization insulating layer 121 may include a photoresist, benzocyclobutene (BCB), polyimide, hexamethyldisiloxane (HMDSO), polymethylmethacrylate (PMMA), polystyrene, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any suitable blends thereof.

Figure 12:
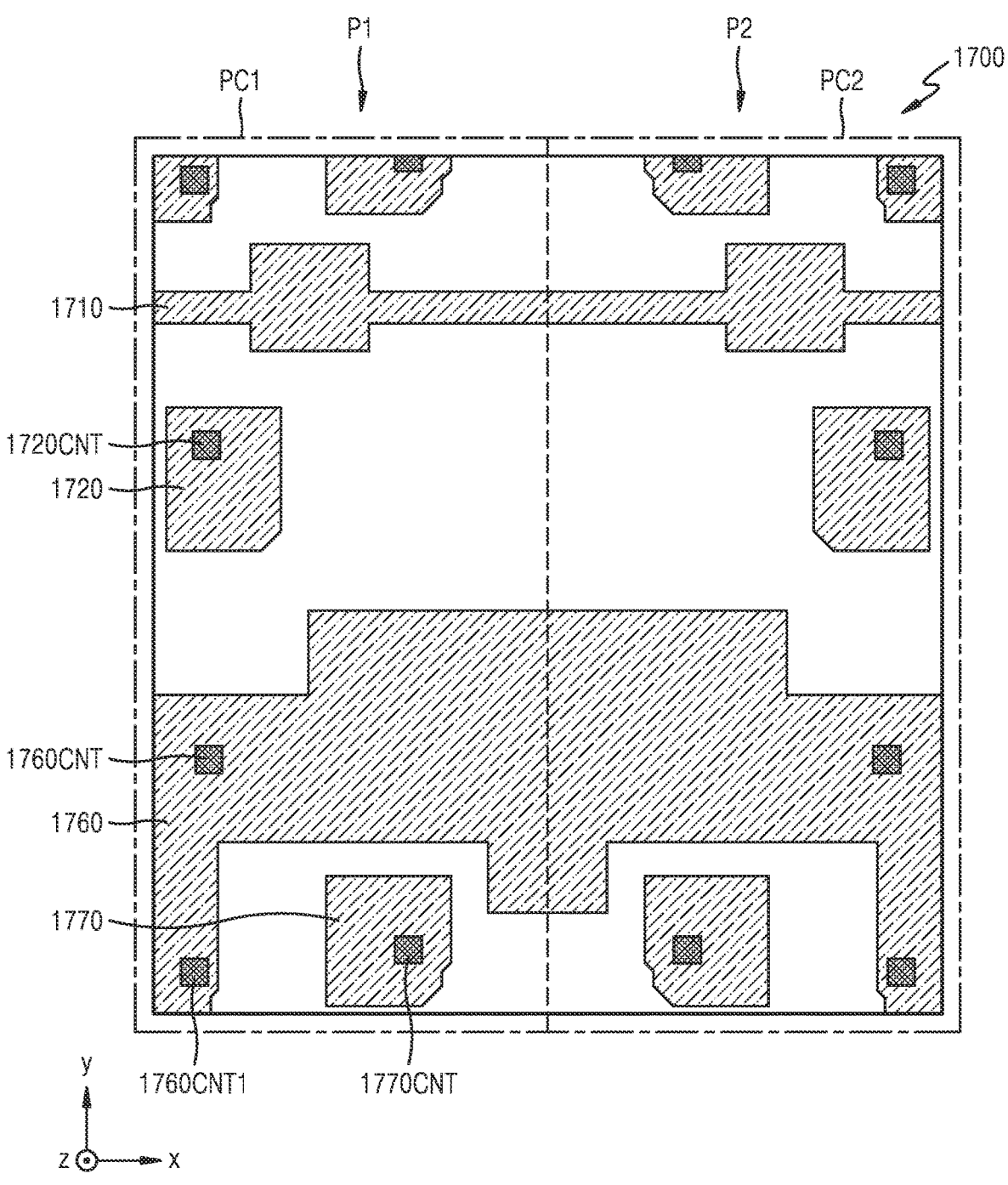

As shown in FIG. 12, a second connection electrode layer 1700 may be disposed on the first planarization insulating layer 121. The second connection electrode layer 1700 may include a horizontal connection line 1710, a seventh transmission line 1720, an eighth transmission line 1760, and a ninth transmission line 1770.

The horizontal connection line 1710 may extend in the first direction (e.g., the x-axis direction). Depending on the positions of pixels, the horizontal connection line 1710 may be any one from among the first horizontal connection line DH1 to the fourth horizontal connection line DH4 and the first auxiliary horizontal connection line ADH1 to the third auxiliary horizontal connection line ADH3, which are described above with reference to FIG. 3. In other words, the second connection electrode layer 1700 may include a horizontal connection line and/or an auxiliary horizontal connection line. This is described in more detail below together with a vertical connection line 1820 illustrated in FIG. 13.

The seventh transmission line 1720 may be electrically connected to the second transmission line 1620 described above via a contact hole 1720CNT. The data signal Dm from a data line 1810 described in more detail below with reference to FIG. 13 may be transmitted to the first semiconductor layer 1100 via the seventh transmission line 1720 and the second transmission line 1620, and may be applied to the switching transistor T2.

The eighth transmission line 1760 may extend in the first direction (e.g., the x-axis direction). A driving voltage ELVDD from a driving voltage line 1830 described in more detail below with reference to FIG. 13 may be transmitted to the eighth transmission line 1760, and the eighth transmission line 1760 that is electrically connected to the first semiconductor layer 1100 via a contact hole 1760CNT1 may be configured to transmit the driving voltage ELVDD to the first semiconductor layer 1100, such as to the operation control transistor T5. In addition, the eighth transmission line 1760 that is electrically connected to the capacitor upper electrode 1330 (e.g., the second capacitor electrode CE2 illustrated in FIG. 4) via a contact hole 1760CNT may be configured to transmit the driving voltage ELVDD to the capacitor upper electrode 1330.

The ninth transmission line 1770 may be electrically connected to the fifth transmission line 1670 via a contact hole 1770CNT. The ninth transmission line 1770 may be configured to receive the driving current from the fifth transmission line 1670, or the second initialization voltage Vint2 from the first semiconductor layer 1100, and may transmit the received driving current or the received second initialization voltage Vint2 to the organic light-emitting diode OLED.

The second connection electrode layer 1700 may include a metal, an alloy, a conductive metal oxide, a transparent conductive material, or the like. For example, the second connection electrode layer 1700 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The second connection electrode layer 1700 may have a multi-layered structure, such as a two-layered structure of a Ti layer and an Al layer, or a three-layered structure of a Ti layer, an Al layer, and another Ti layer.

A second planarization insulating layer 123 (e.g., see FIG. 14) may be disposed on the first planarization insulating layer 121, and may cover the second connection electrode layer 1700. The second planarization insulating layer 123 may include an organic insulating material. For example, the second planarization insulating layer 123 may include a photoresist, BCB, polyimide, HMDSO, PMMA, polystyrene, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any suitable blends thereof.

Figure 13:
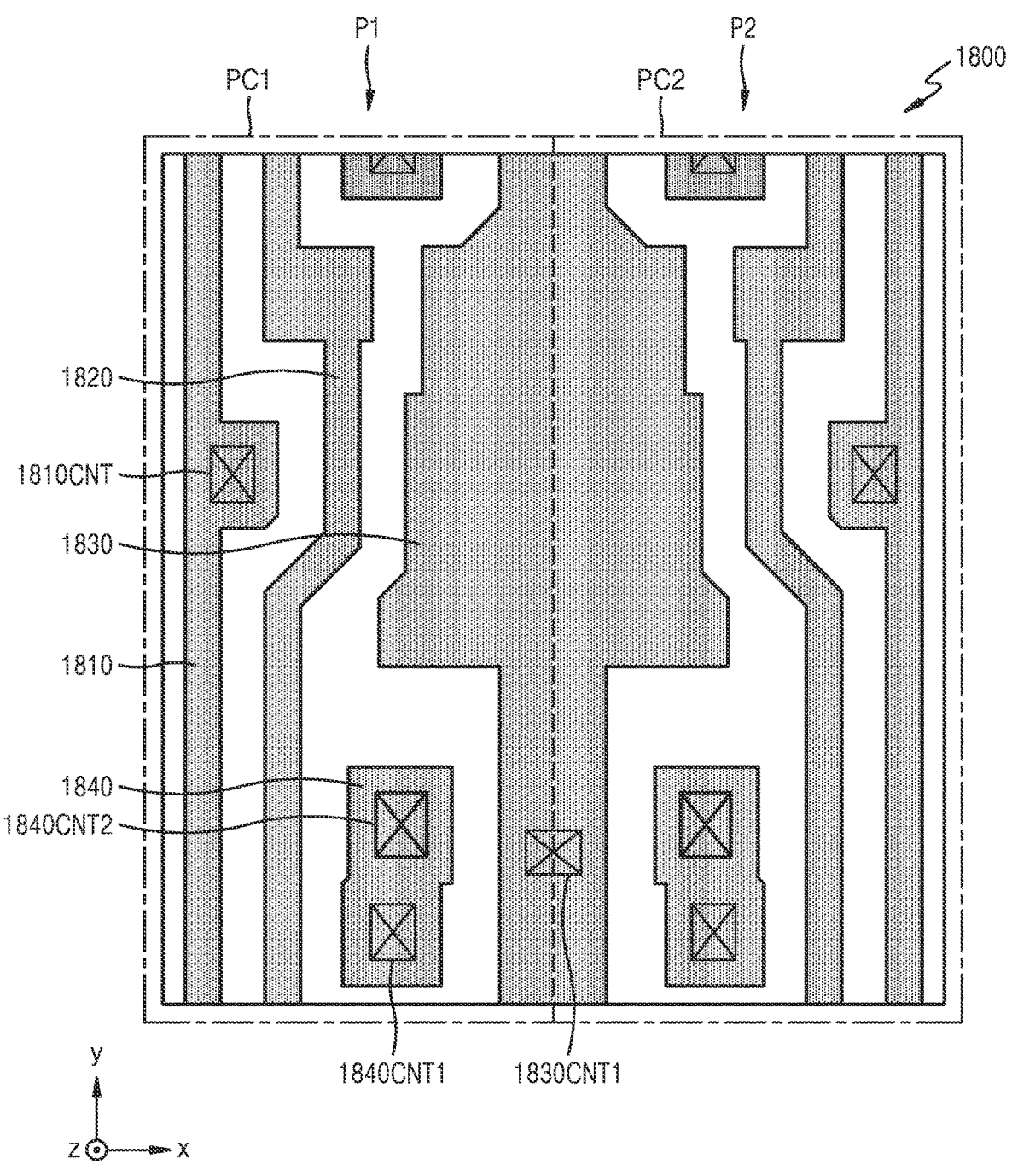
Figure 14:
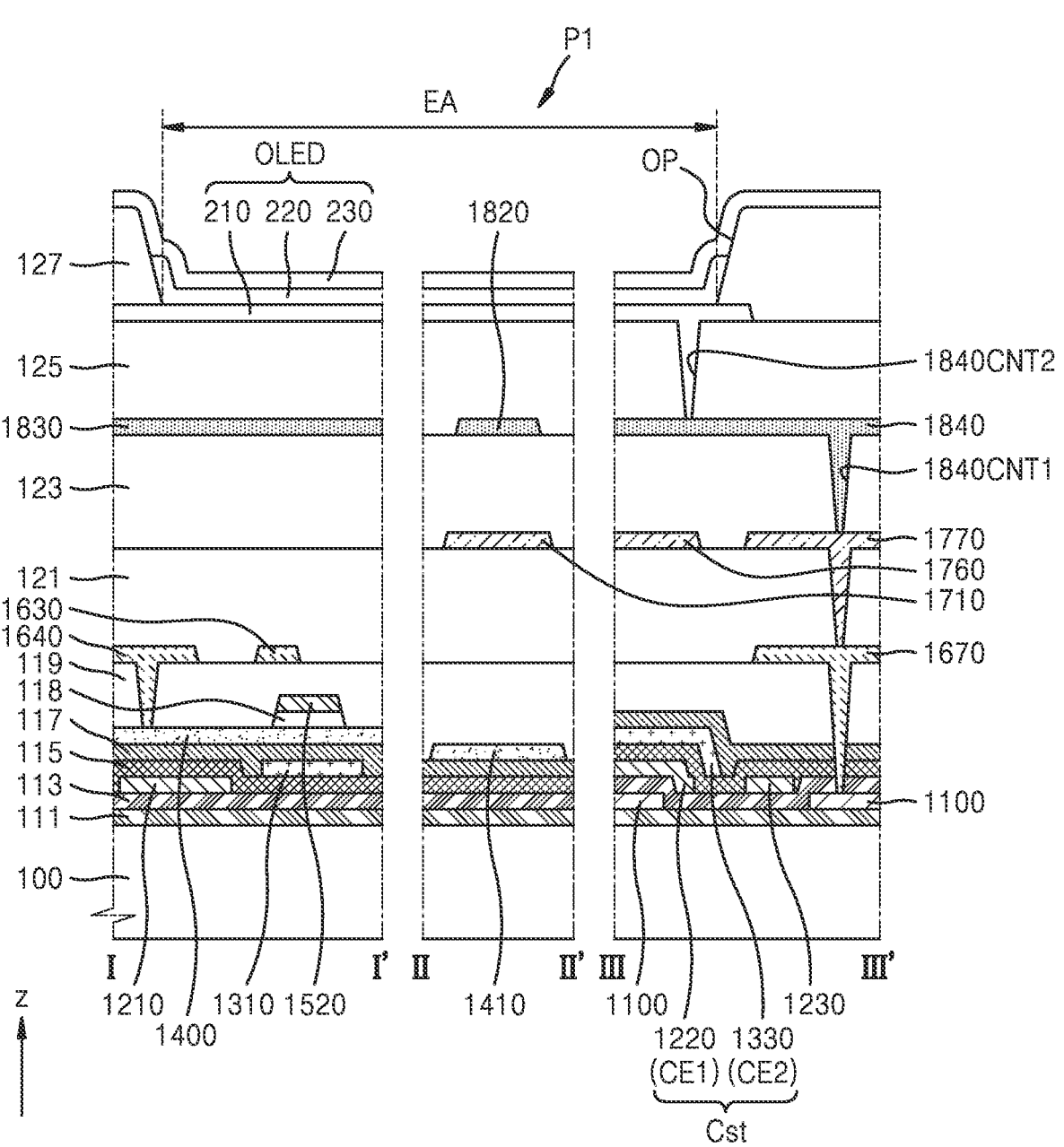
FIG. 14 is a cross-sectional view schematically illustrating cross-sections taken along the lines I-I', II-II', and III-III' of the display apparatus of FIG. 5.

As shown in FIG. 13, a third connection electrode layer 1800 may be disposed on the second planarization insulating layer 123. The third connection electrode layer 1800 may include a data line 1810, a vertical connection line 1820, a driving voltage line 1830, and a tenth transmission line 1840.

The data line 1810 may extend in the second direction (e.g., the y-axis direction). The data line 1810 may correspond to the data line DL illustrated in FIG. 4. The data line 1810 may be electrically connected to the seventh transmission line 1720 via a contact hole 1810CNT, and the data signal Dm from the data line 1810 may be transmitted to the first semiconductor layer 1100 via the seventh transmission line 1720 and the second transmission line 1620, and may be applied to the switching transistor T2. The data line 1810 may be any one of the first to sixth data lines DL1 to DL6 described above with reference to FIG. 3.

The vertical connection line 1820 may extend in or substantially in the second direction (e.g., the y-axis direction). Depending on the positions of the pixels, the vertical connection line 1820 may be any one of the first vertical connection line DV1' to the third vertical connection line DV3', the first additional vertical connection line DV1 to a third additional vertical connection line DV3, the first auxiliary vertical connection line ADV1' to the third auxiliary vertical connection line ADV3', and the first auxiliary additional vertical connection line ADV1 to the third auxiliary additional vertical connection line ADV3, which are described above with reference to FIG. 3. In other words, the third connection electrode layer 1800 may include a vertical connection line, an additional vertical connection line, an auxiliary vertical connection line, and/or an auxiliary additional vertical connection line.

For example, the data line 1810 illustrated in FIG. 13 may be the sixth data line DL6 illustrated in FIG. 3, the vertical connection line 1820 may be the third vertical connection line DV3', and the horizontal connection line 1710 illustrated in FIGS. 12 and 14 may be the second auxiliary horizontal connection line ADH2. In this case, FIGS. 5 through 13 may be plan views illustrating the pixels positioned at a region in which the sixth data line DL6 and the third vertical connection line DV3' cross the second auxiliary horizontal connection line ADH2 illustrated in FIG. 3. As another example, the data line 1810 illustrated in FIG. 13 may be the fifth data line DL5 illustrated in FIG. 3, the vertical connection line 1820 may be the third additional vertical connection line DV3, and the horizontal connection line 1710 illustrated in FIG. 12 may be the first auxiliary horizontal connection line ADH1. In this case, FIGS. 5 through 13 may be plan views illustrating the pixels positioned at a region in which the fifth data line DL5 and the third additional vertical connection line DV3 cross the first auxiliary horizontal connection line ADH1 illustrated in FIG. 3.

As another example, the data line 1810 illustrated in FIG. 13 may be the fifth data line DL5 illustrated in FIG. 3, the vertical connection line 1820 may be the third additional vertical connection line DV3, and the horizontal connection line 1710 illustrated in FIG. 12 may be the third horizontal connection line DH3. In this case, the vertical connection line 1820 and the horizontal connection line 1710 may be electrically connected to each other at (e.g., in or on) the display area DA (e.g., see FIG. 3) via a contact hole defined in an insulating layer between the vertical connection line 1820 and the horizontal connection line 1710. The contact hole defined in the insulating layer between the vertical connection line 1820 and the horizontal connection line 1710 may be the first connection contact hole DH-CNT1 described above with reference to FIG. 3. In this case, FIGS. 5 through 13 may be plan views illustrating pixels positioned at a region in which the fifth data line DL5 and the third additional vertical connection line DV3 cross the third horizontal connection line DH3 illustrated in FIG. 3.

As another example, the data line 1810 illustrated in FIG. 13 may be the fourth data line DL4 illustrated in FIG. 3, the vertical connection line 1820 may be the second auxiliary vertical connection line ADV2', and the horizontal connection line 1710 illustrated in FIG. 12 may be the third horizontal connection line DH3. In this case, FIGS. 5 through 13 may be plan views illustrating pixels positioned at a region in which the fourth data line DL4 and the second auxiliary vertical connection line ADV2' cross the third horizontal connection line DH3 illustrated in FIG. 3. As another example, the data line 1810 illustrated in FIG. 13 may be the third data line DL3 illustrated in FIG. 3, the vertical connection line 1820 may be the second auxiliary additional vertical connection line ADV2, and the horizontal connection line 1710 illustrated in FIG. 12 may be the third horizontal connection line DH3. In this case, FIGS. 5 through 13 may be plan views illustrating pixels positioned at a region in which the third data line DL3 and the second auxiliary additional vertical connection line ADV2 cross the third horizontal connection line DH3 illustrated in FIG. 3.

Depending on the position of pixels, the data line 1810 illustrated in FIG. 13 may be the sixth data line DL6 illustrated in FIG. 3, the vertical connection line 1820 may be the third vertical connection line DV3', and the horizontal connection line 1710 illustrated in FIG. 12 may be the third horizontal connection line DH3. In this case, the vertical connection line 1820 and the horizontal connection line 1710 may be electrically connected to each other at (e.g., in or on) the display area DA (e.g., see FIG. 3) via a contact hole defined in an insulating layer between the vertical connection line 1820 and the horizontal connection line 1710. The contact hole defined in the insulating layer between the vertical connection line 1820 and the horizontal connection line 1710 may be the second connection contact hole DH-CNT2 described above with reference to FIG. 3. The vertical connection line 1820 may be electrically connected to the data line 1810 at (e.g., in or on) the peripheral area PA outside the display area DA, such that the vertical connection line 1820 and the data line 1810 may be integrally formed with each other as a single body, as described above with reference to FIG. 3. In this case, FIGS. 5 through 13 may be plan views illustrating pixels positioned at a region in which the sixth data line DL6 and the third vertical connection line DV3' cross the third horizontal connection line DH3 illustrated in FIG. 3.

The first input line IL1 to the sixth input line IL6 described above with reference to FIG. 3 may be located below the vertical connection line 1820. In other words, the first input line IL1 to the sixth input line IL6 may be located on the first gate layer 1200, on the second gate layer 1300, on the third gate layer 1500, on the first connection electrode layer 1600, or on the second connection electrode layer 1700. As another example, the first input line IL1 to the sixth input line IL6 may have a structure in which at least two of a conductive layer positioned on the first gate layer 1200, a conductive layer positioned on the second gate layer 1300, a conductive layer positioned on the third gate layer 1500, a conductive layer positioned on the first connection electrode layer 1600, and a conductive layer positioned on the second connection electrode layer 1700 are connected to each other via a contact hole.

The driving voltage line 1830 may extend in or substantially in the second direction (e.g., the y-axis direction). The driving voltage line 1830 may correspond to the driving voltage line PL illustrated in FIG. 4. The driving voltage line 1830 may apply the driving voltage ELVDD to the pixels. The driving voltage line 1830 may be electrically connected to the eighth transmission line 1760 via a contact hole 1830CNT1, and thus, as described above, the driving voltage ELVDD may be transmitted to the operation control transistor T5 and the capacitor upper electrode 1330. The driving voltage line 1830 of the first pixel circuit PC1 and the driving voltage line 1830 of the second pixel circuit PC2 adjacent thereto may be integrally formed with each other as a single body.

The tenth transmission line 1840 may be electrically connected to the ninth transmission line 1770 via a contact hole 1840CNT1, and thus, may receive the driving current or the second initialization voltage Vint2 from the first semiconductor layer 1100 via the fifth transmission line 1670 and the ninth transmission line 1770. In addition, the tenth transmission line 1840 may transmit the driving current or the second initialization voltage Vint2 from the first semiconductor layer 1100 to the first electrode (e.g., the pixel electrode) of the organic light-emitting diode OLED via a contact hole 1840CNT2 defined in an insulating layer disposed over the tenth transmission line 1840.

The third connection electrode layer 1800 may include a metal, an alloy, a conductive metal oxide, or a transparent conductive material. For example, the third connection electrode layer 1800 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The third connection electrode layer 1800 may have a multi-layered structure, such as a two-layered structure of a Ti layer and an Al layer, or a three-layered structure of a Ti layer, an Al layer, and another Ti layer.

As shown in FIG. 14, the third planarization insulating layer 125 may cover the third connection electrode layer 1800, and may be disposed on the second planarization insulating layer 123. The third planarization insulating layer 125 may include an organic insulating material. For example, the third planarization insulating layer 125 may include a photoresist, BCB, polyimide, HMDSO, PMMA, polystyrene, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any suitable blends thereof.

An organic light-emitting diode OLED may be located on the third planarization insulating layer 125. The organic light-emitting diode OLED may include a pixel electrode 210 as a first electrode, an intermediate layer 220 including an emission layer, and an opposite electrode 230 as a second electrode.

The pixel electrode 210 may include a (semi-)light-transmitting electrode or a reflective electrode. For example, the pixel electrode 210 may include a reflective layer, and a transparent or semi-transparent electrode layer disposed on the reflective layer. The reflective layer may include Ag, magnesium (Mg), Al, Pt, palladium (Pd), gold (Au), Ni, neodymium (Nd), iridium (Ir), Cr, or a suitable compound thereof. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may have a three-layered structure of an ITO layer, an Ag layer, and another ITO layer.

A pixel-defining layer 127 may be disposed on the third planarization insulating layer 125. The pixel-defining layer

127 may prevent or substantially prevent an arc or the like from occurring at the edge of the pixel electrode 210, by increasing a distance between the edge of the pixel electrode 210 and the opposite electrode 230 above the pixel electrode 210.

The pixel-defining layer 127 may include one or more organic insulating materials selected from the group consisting of polyimide, polyamide, an acryl-based resin, BCB, and a phenolic resin, and may be provided by a suitable method, such as spin coating.

At least a portion of the intermediate layer 220 of the organic light-emitting diode OLED may be located in an opening OP defined by (e.g., penetrating) the pixel-defining layer 127. An emission area EA of the organic light-emitting diode OLED may be defined by the opening OP.

As described above, the intermediate layer 220 may include an emission layer. The emission layer may include an organic material including a fluorescent or phosphorous material for emitting red, green, blue, or white light. The emission layer may include a low-molecular weight organic material or a polymer organic material. In some embodiment, the intermediate layer 220 may further selectively include a functional layer disposed under and/or over the emission layer, for example, such as a hole transport layer (HTL), a hole injection layer (HIL), an electron transport layer (ETL), and/or an electron injection layer (EIL).

The emission layer may have a patterned shape to correspond to each of the pixel electrodes 210. A layer included in the intermediate layer 220, except for the emission layer, may be integrally formed as a single body over a plurality of pixel electrodes 210, and various modifications may be made as needed or desired.

The opposite electrode 230 may be a light-transmitting electrode or a reflective electrode. For example, the opposite electrode 230 may be a transparent or semi-transparent electrode, and may include a metal thin film having a low work function, which includes lithium (Li), calcium (Ca), lithium fluoride (LiF), Al, Ag, Mg, and a suitable compound thereof. In addition, the opposite electrode 230 may further include a transparent conductive oxide (TCO) layer, which may include ITO, IZO, ZnO, $In_2O_3$, or the like. The opposite electrode 230 may be integrally formed as a single body over the entire or substantially the entire surface of the display area DA, and may be disposed over the intermediate layer 220 and the pixel-defining layer 127. The second power supply line 16 described above may be electrically connected to the opposite electrode 230, and may apply the second power voltage ELVSS to the opposite electrode 230.

As described above, the third gate line 1310, which may be referred to as an initialization gate line, may extend in the first direction (e.g., the x-axis direction), and may periodically turn on or turn off the first initialization transistor T4. As such, a periodically changing electrical signal flows through the third gate line 1310. Accordingly, the horizontal connection line 1710, which is located at (e.g., in or on) a different layer from that of the third gate line 1310, but is adjacent to the third gate line 1310 in a plan view and extends in the first direction (e.g., the x-axis direction), may be electrically influenced by the third gate line 1310. As described above, the horizontal connection line 1710 is electrically connected to the data line 1810 according to a position in the display area DA, and transmits a data signal Dm to the data line 1810. When the horizontal connection line 1710 is periodically electrically influenced by the third gate line 1310, the data line 1810 electrically connected to the horizontal connection line 1710 may also be periodically electrically influenced by the third gate line 1310. This may eventually cause an unintended change in the luminance of the pixels connected to the data line 1810, and thus, the quality of an image displayed by a display apparatus may be deteriorated.

However, the display apparatus according to one or more embodiments of the present disclosure may include the shield layer 1410, as described above. The shield layer 1410 is included in the second semiconductor layer 1400 located between the second gate layer 1300 including the third gate line 1310 and the second connection electrode layer 1700 including the horizontal connection line 1710. Accordingly, the electrical influence on the horizontal connection line 1710 by the third gate line 1310 may be prevented or reduced. In more detail, as described above, the first initialization voltage Vint1, which is a constant or substantially constant voltage, is applied to the shield layer 1410 from the first initialization voltage line 1340. As such, because the constant voltage is applied to the shield layer 1410, the electrical influence of the horizontal connection line 1710 from the third gate line 1310 in which an electrical signal is periodically changed may be more effectively prevented or reduced.

In order for the shield layer 1410 to more effectively shield the horizontal connection line 1710, the shield layer 1410 may overlap with the horizontal connection line 1710 when viewed in a direction (e.g., the z-axis direction) perpendicular to or substantially perpendicular to the substrate 100 (e.g., in a plan view), as shown in FIGS. 5, 9, 10, 12, and 14. In more detail, when viewed in a direction (e.g., the z-axis direction) perpendicular to or substantially perpendicular to the substrate 100 (e.g., in a plan view), in a region in which the shield layer 1410 and the horizontal connection line 1710 overlap with each other, the horizontal connection line 1710 may be located in the shield layer 1410.

In addition, the shield layer 1410 may include a portion overlapping with the third gate line 1310, which is an initialization gate line. Accordingly, the electrical influence of the third gate line 1310 on the horizontal connection line 1710 may be prevented or reduced. For example, the shield layer 1410 may overlap with a portion of the third gate line 1310, which is indicated by reference numeral 1312 in FIG. 8.

Figure 15:
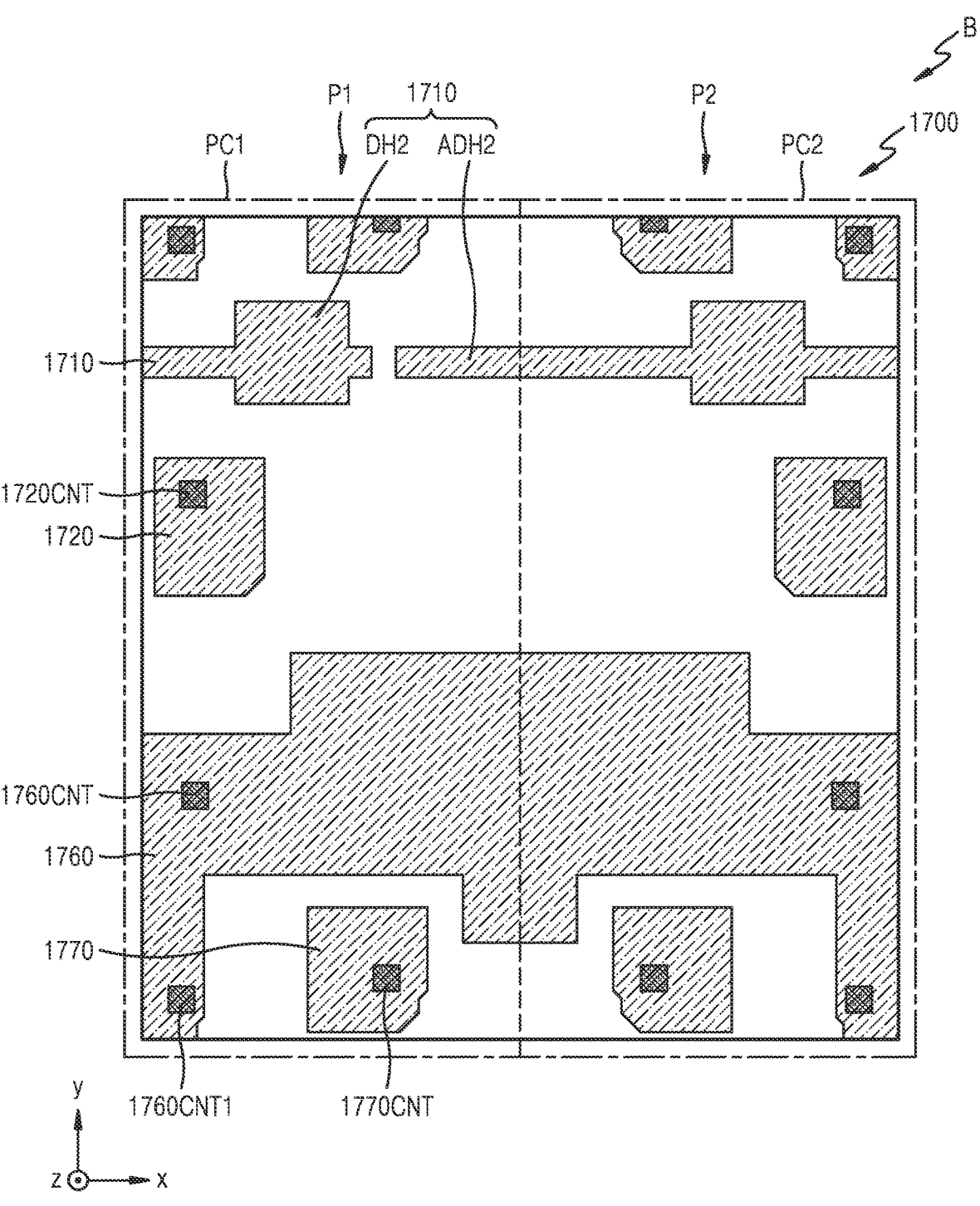
FIGS. 15-17 are enlarged plan views schematically illustrating layers positioned in the portion B of the display apparatus shown in FIG. 3.
Figure 16:
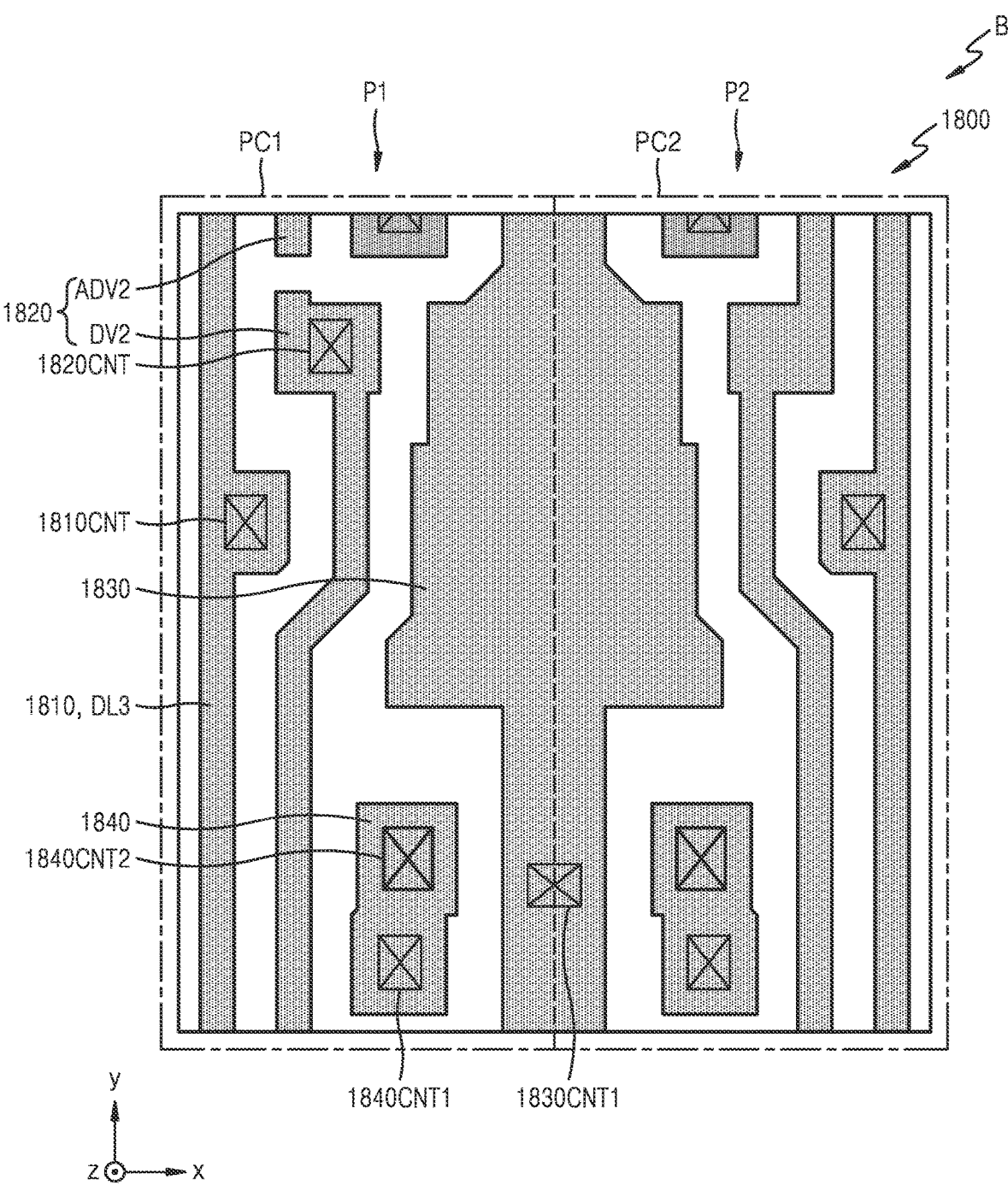
Figure 17:
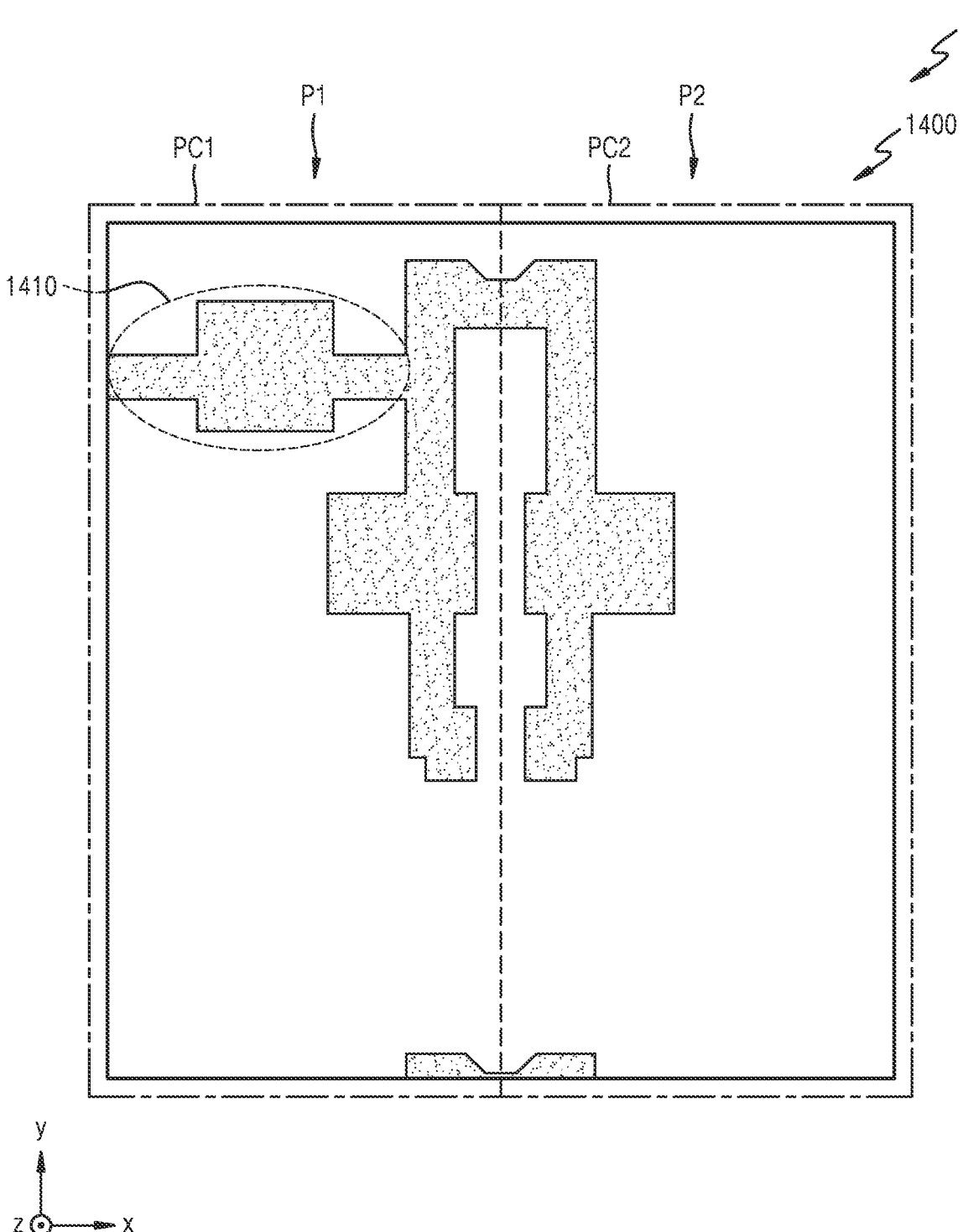

FIGS. 15 through 17 are enlarged plan views schematically illustrating layers positioned in the portion B of the display apparatus shown in FIG. 3. As described above with reference to FIG. 3, in the portion B, the second horizontal connection line DH2 is electrically connected to the second additional vertical connection line DV2 via the first connection contact hole DH-CNT1 defined at one end (e.g., in the +x direction) of the second horizontal connection line DH2. A second auxiliary horizontal connection line ADH2 that is spaced apart from the second horizontal connection line DH2 is located on the other side (e.g., in the +x direction) of the second horizontal connection line DH2. In addition, a second auxiliary additional vertical connection line ADV2 is located on one side (e.g., in the +y direction) of the second additional vertical connection line DV2.

FIG. 15 illustrates the second horizontal connection line DH2 and the second auxiliary horizontal connection line ADH2. In other words, the horizontal connection line 1710 may be cut in two (e.g., may be divided into two parts) in the portion B as shown in FIG. 15, and thus, one of the two parts may be the second horizontal connection line DH2, and the other of the two parts may be the second auxiliary horizontal connection line ADH2.

FIG. 16 illustrates the second additional vertical connection line DV2 and the second auxiliary additional vertical connection line ADV2. In other words, the vertical connection line 1820 may be cut in two (e.g., may be divided into two parts) in the portion B as shown in FIG. 16, and thus, one of the two parts may be the second additional vertical connection line DV2, and the other of the two parts may be the second auxiliary additional vertical connection line ADV2. A contact hole 1820CNT illustrated in FIG. 16 corresponds to the first connection contact hole DH-CNT1 described above with reference to FIG. 3, and is a contact hole via which the second additional vertical connection line DV2 is connected to the second horizontal connection line DH2.

As shown in FIG. 17, the shield layer 1410 may be located to correspond to the second horizontal connection line DH2, and may prevent or reduce the electrical influence of the third gate line 1310 on the second horizontal connection line DH2. In this case, the shield layer 1410 may not be located in the second pixel P2. In other words, the shield layer 1410 may extend in the first direction (e.g., the x-axis direction), and may overlap with the second horizontal connection line DH2, but may not overlap with the second auxiliary horizontal connection line ADH2. As described above, because the second auxiliary horizontal connection line ADH2 is not electrically connected to the data lines, there may be no need to shield the second auxiliary horizontal connection line ADH2. Accordingly, the shield layer 1410 may not overlap with the second auxiliary horizontal connection line ADH2.

Figure 18:
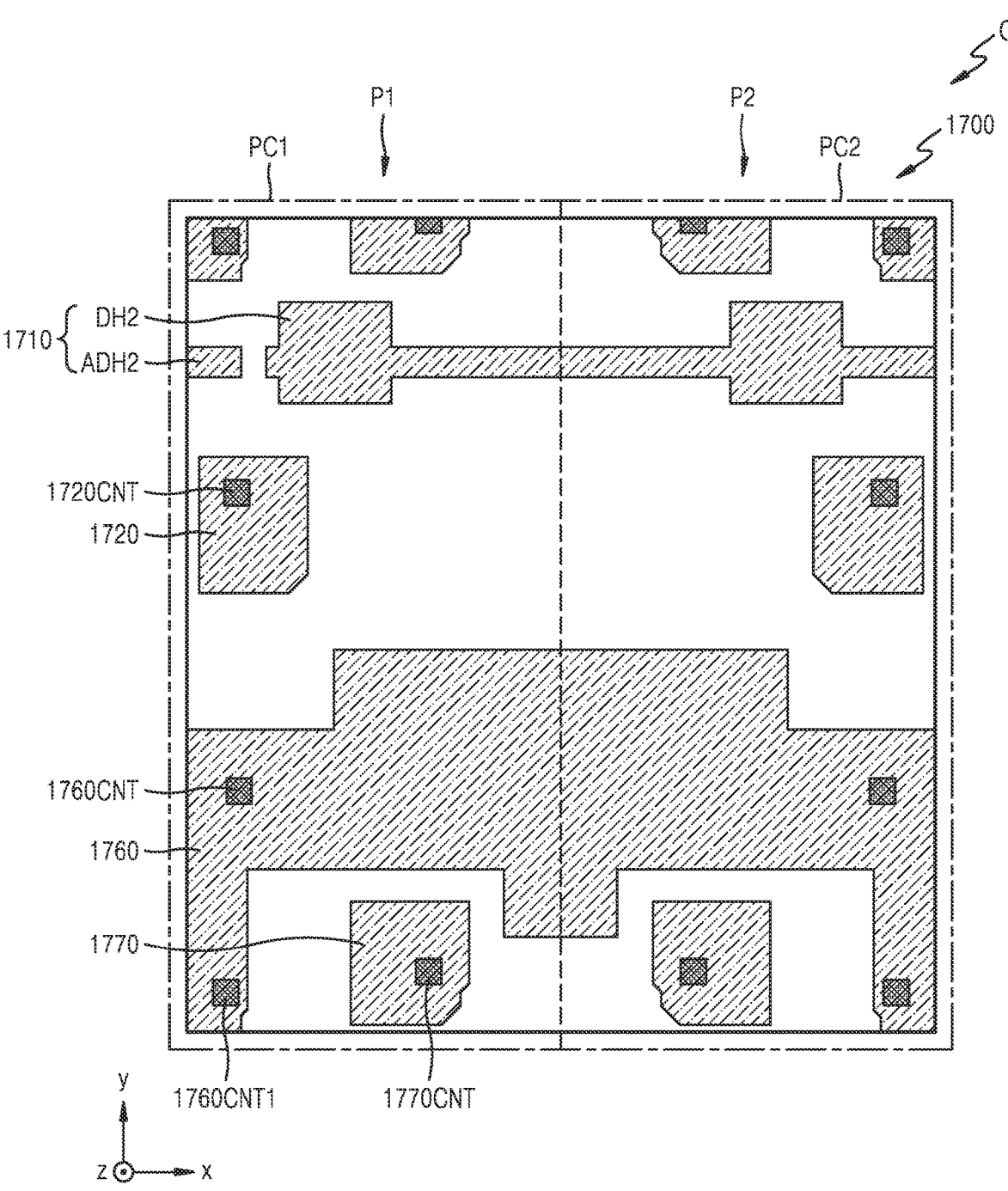
FIGS. 18-20 are enlarged plan views schematically illustrating layers positioned in the portion C of the display apparatus shown in FIG. 3.
Figure 19:
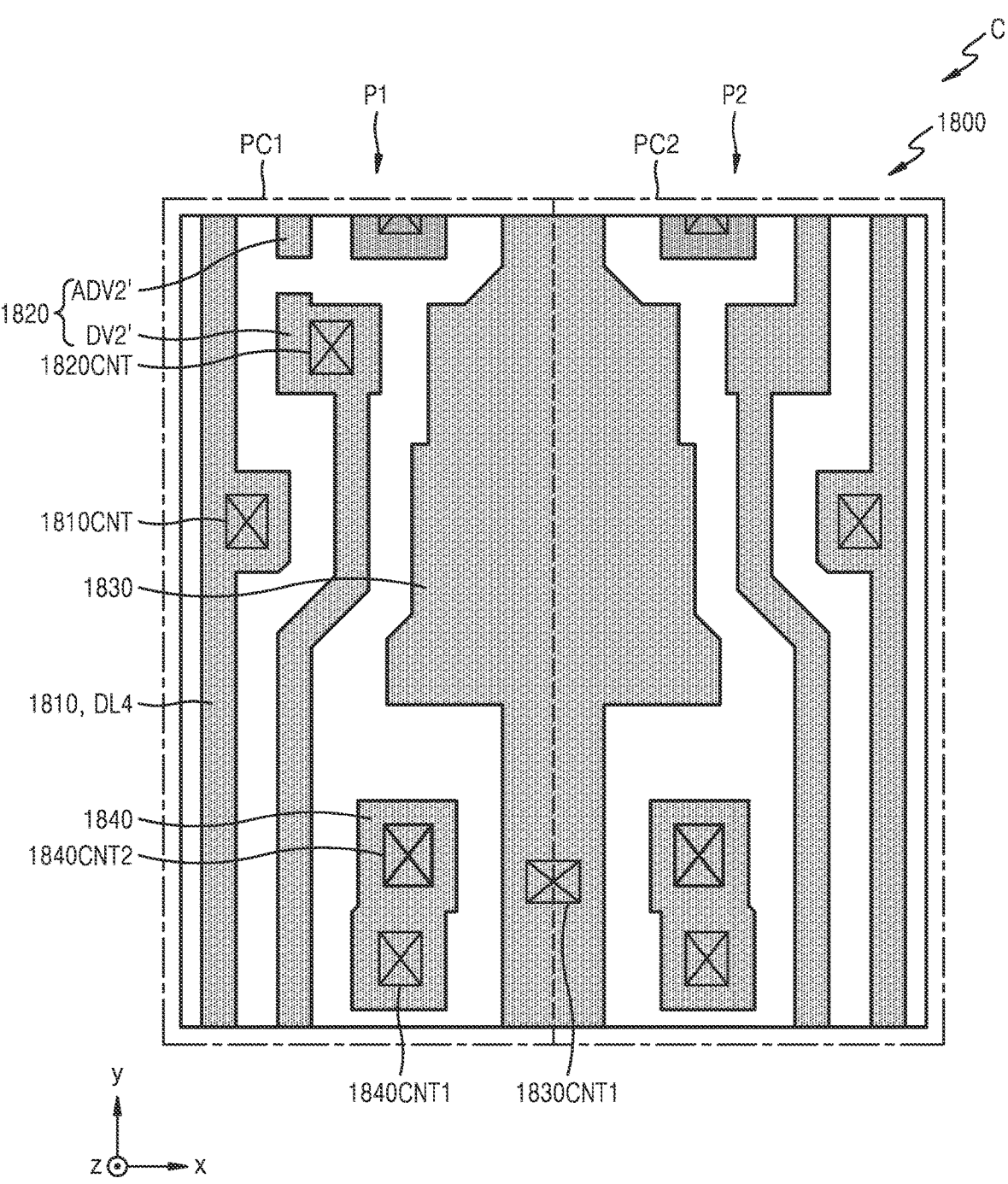
Figure 20:
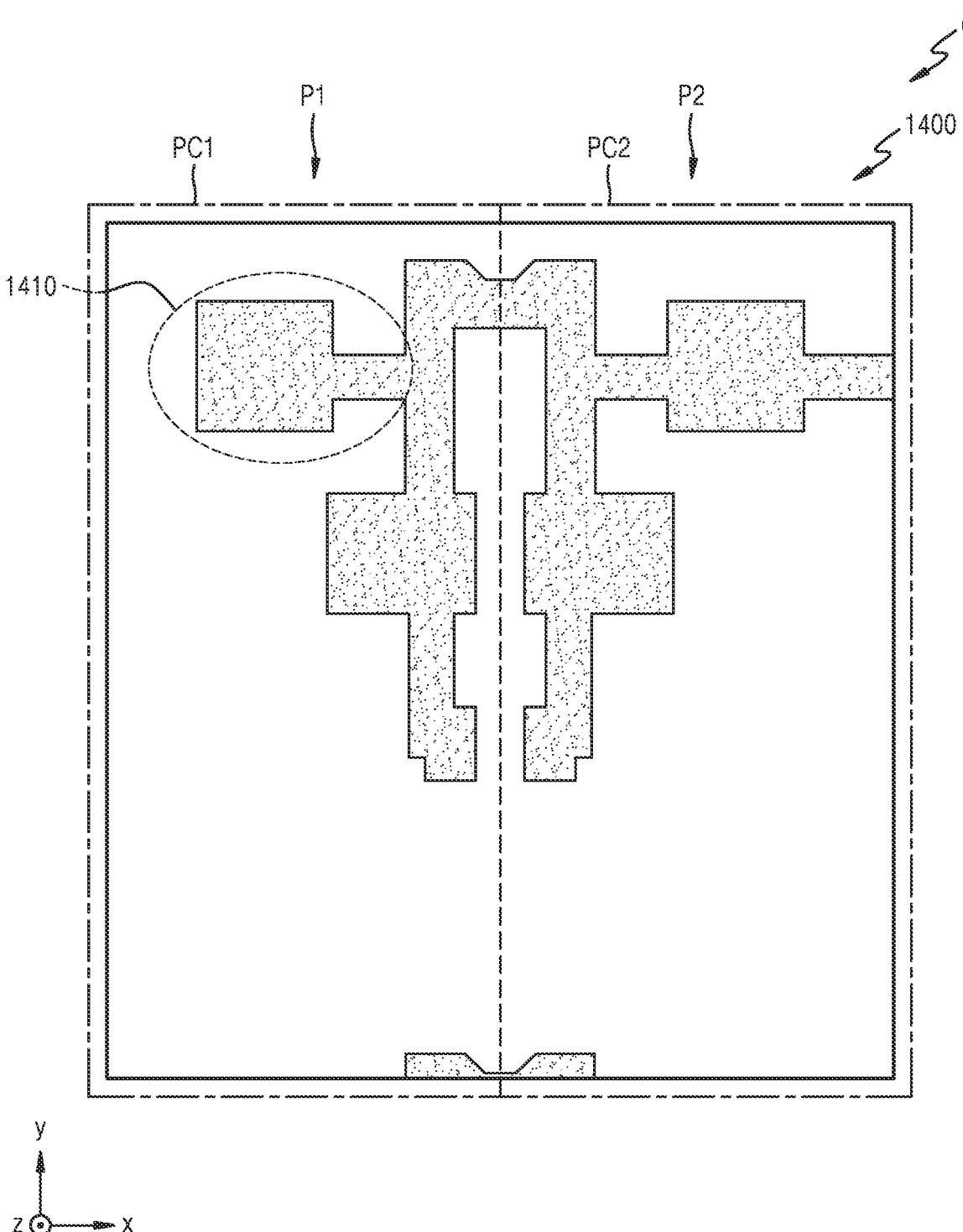

FIGS. 18 through 20 are enlarged plan views schematically illustrating layers positioned in the portion C of the display apparatus shown in FIG. 3. As described above with reference to FIG. 3, in the portion C, the second horizontal connection line DH2 is electrically connected to the second vertical connection line DV2' via the second connection contact hole DH-CNT2 defined at the other end (e.g., in the −x direction) of the second horizontal connection line DH2, and thus, is electrically connected to the fourth data line DL4. In addition, a second auxiliary horizontal connection line ADH2 that is spaced apart from the second horizontal connection line DH2 is located on one side (e.g., in the −x direction) of the second horizontal connection line DH2. In addition, a second auxiliary vertical connection line ADV2' is located on one side (e.g., in the +y direction) of the second vertical connection line DV2'.

FIG. 18 illustrates the second horizontal connection line DH2 and the second auxiliary horizontal connection line ADH2. In other words, the horizontal connection line 1710 may be cut in two (e.g., may be divided into two parts) in the portion C as shown in FIG. 18, and thus, one of the two parts may be the second horizontal connection line DH2, and the other of the two parts may be the second auxiliary horizontal connection line ADH2.

FIG. 19 illustrates the second vertical connection line DV2' and the second auxiliary vertical connection line ADV2'. In other words, the vertical connection line 1820 may be cut in two (e.g., may be divided into two parts) in the portion C as shown in FIG. 19, and thus, one of the two parts may be the second vertical connection line DV2', and the other of the two parts may be the second auxiliary vertical connection line ADV2'. A contact hole 1820CNT in FIG. 19 corresponds to the second connection contact hole DH-CNT2 described above with reference to FIG. 3, and is a contact hole via which the second vertical connection line DV2' is connected to the second horizontal connection line DH2.

As shown in FIG. 20, the shield layer 1410 may be located to correspond to the second horizontal connection line DH2, and may prevent or reduce the electrical influence of the third gate line 1310 on the second horizontal connection line DH2. In this case, the length of the shield layer 1410 in the first direction (e.g., the x-axis direction) in the first pixel P1 may be less than the length of the shield layer 1410 in the first direction (e.g., the x-axis direction) in the second pixel P2. This is because the shield layer 1410 extends in the first direction (e.g., the x-axis direction), and overlaps with the second horizontal connection line DH2, but does not overlap with the second auxiliary horizontal connection line ADH2. As described above, because the second auxiliary horizontal connection line ADH2 is not electrically connected to the data lines, there may be no need to shield the second auxiliary horizontal connection line ADH2. Accordingly, the shield layer 1410 may not overlap with the second auxiliary horizontal connection line ADH2.

Figure 21:
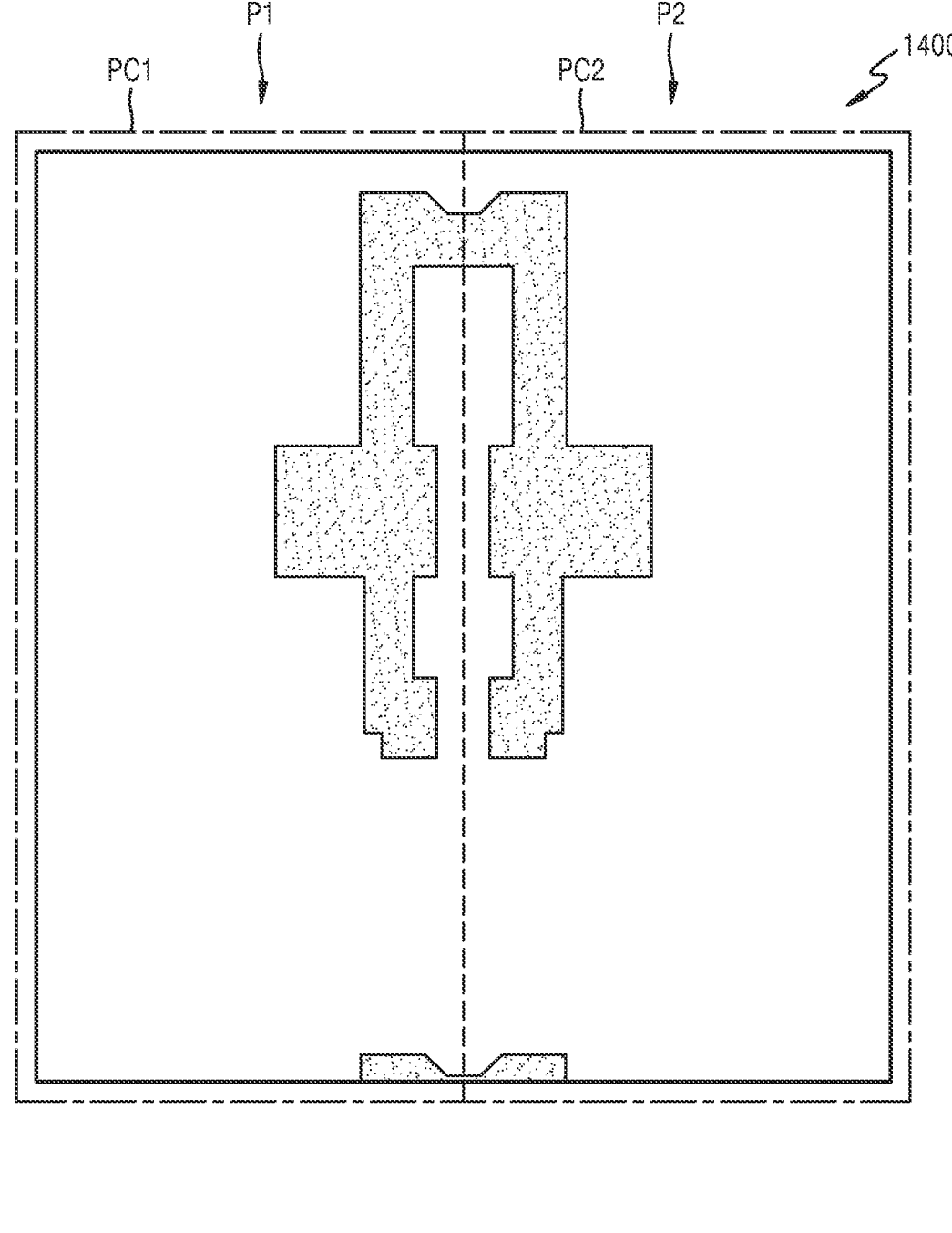
FIG. 21 is an enlarged plan view schematically illustrating a layer positioned in a portion of the display apparatus shown in FIG. 3.

FIG. 21 is an enlarged plan view schematically illustrating a layer positioned in a portion of the display apparatus shown in FIG. 3. In more detail, FIG. 21 is a plan view of the second semiconductor layer 1400 of the pixels positioned in a region through which the fourth horizontal connection line DH4 illustrated in FIG. 3 passes.

As described above, the pixels at (e.g., in or on) the display area DA may have the same or substantially the same structure or a similar structure as each other in a plan view. Accordingly, like the fourth horizontal connection line DH4 described above, there may be horizontal connection lines that are not electrically connected to the data lines, and that extend from the first peripheral area PA1 on one side (e.g., in the −x direction) of the display area DA to the first peripheral area PA1 on the other side (e.g., in the +x direction) of the display area DA. Accordingly, as there is the fourth horizontal connection line DH4, a structural difference between the pixels through which the third horizontal connection line DH3 and the like pass and the pixels located at (e.g., in or on) the center of the display area DA may be reduced. Both ends of each of the fourth horizontal connection lines DH4, which are not electrically connected to the data lines, may be electrically connected to, for example, the second power supply line 16. Accordingly, the second power voltage (or the common voltage) ELVSS may be transmitted uniformly or substantially uniformly to the opposite electrode 230 throughout the display area DA.

Because the fourth horizontal connection lines DH4 are not electrically connected to the data lines, there may be no need to shield the fourth horizontal connection lines DH4 from the initialization gate lines. Accordingly, the shield layer 1410 may not be provided in the pixels positioned in a region through which the fourth horizontal connection line DH4 passes. Accordingly, because the shield layer 1410 is not provided in such pixels, the second semiconductor layer 1400 may have an isolated (e.g., an island) shape, as shown in FIG. 21. When the shield layer 1410 is also provided in such pixels, a parasitic capacitance may be formed between the shield layer 1410 to which the first initialization voltage Vint1 is applied, which is a or substantially constant voltage, and the fourth horizontal connection line DH4 to which the second power voltage ELVSS is applied, which is a constant or substantially constant voltage, and thus, a display quality of an image may be reduced.

Figure 22:
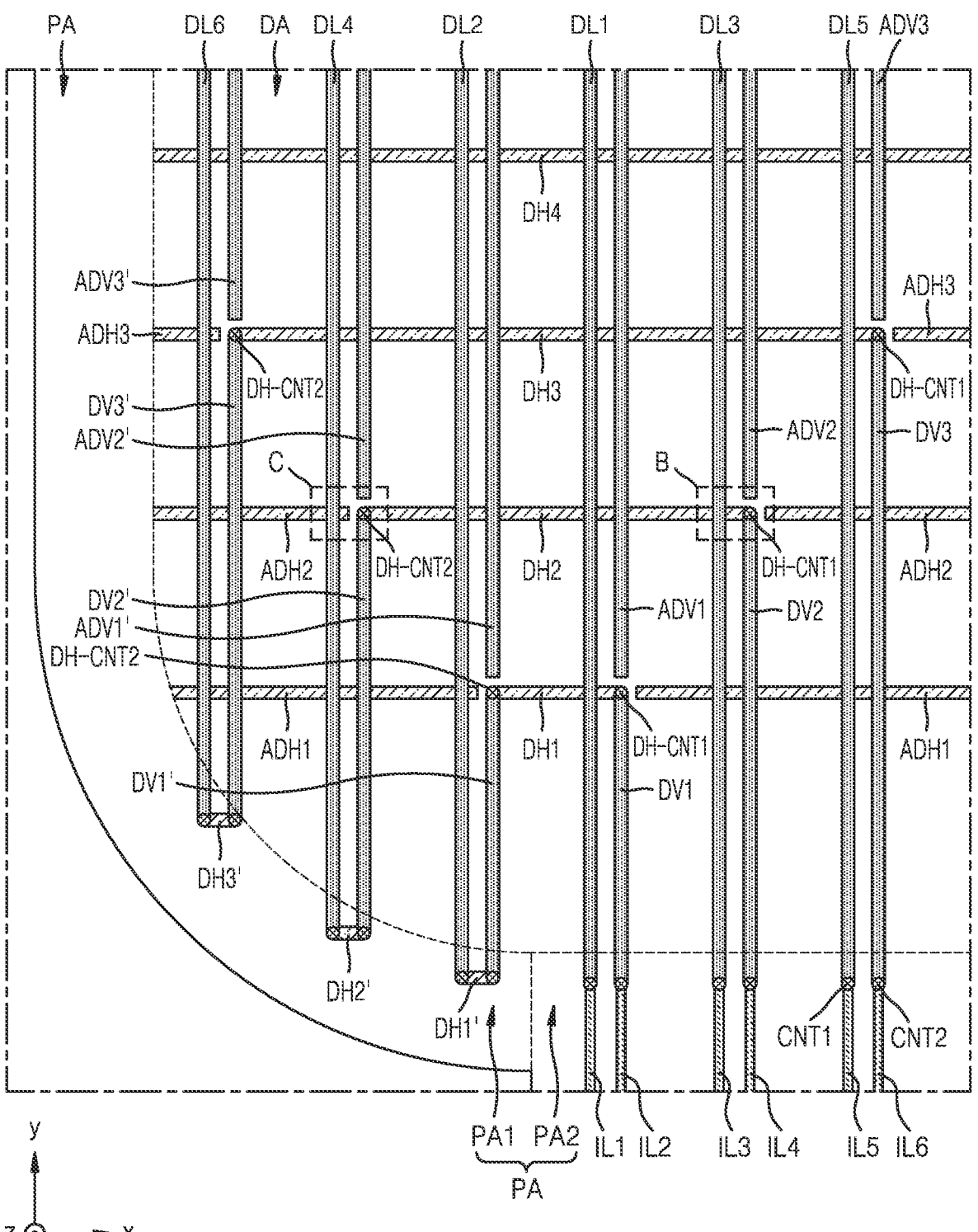
FIG. 22 is an enlarged plan view schematically illustrating a portion of a display apparatus according to an embodiment.

FIG. 22 is an enlarged plan view schematically illustrating a portion of a display apparatus according to an embodiment. FIG. 3 illustrates an example in which each of the first vertical connection line DV1', the second vertical connection line DV2', and the third vertical connection line DV3' is integrated with a corresponding one of the second data line DL2, the fourth data line DL4, and the sixth data line DL6 to form an integral single body therewith. However, the present disclosure is not limited thereto. For example, as shown in FIG. 22, which is a plan view schematically illustrating a portion of a display apparatus according to an embodiment, the first vertical connection line DV1' may be electrically connected to the second data line DL2 via a first horizontal intermediate line DH1', the second vertical connection line DV2' may be electrically connected to the fourth data line DL4 via a second horizontal intermediate line DH2', and the third vertical connection line DV3' may be electrically connected to the sixth data line DL6 via a third horizontal intermediate line DH3'.

Because the third connection electrode layer 1800 (e.g., as shown in FIG. 13) may include the first vertical connection line DV1', the second vertical connection line DV2', the third vertical connection line DV3', the second data line DL2, the fourth data line DL4, and the sixth data line DL6, the first horizontal intermediate line DH1', the second horizontal intermediate line DH2', and the third horizontal intermediate line DH3' may be located at (e.g., in or on) a conductive layer located under (e.g., underneath) the third connection electrode layer 1800. For example, the second connection electrode layer 1700 (e.g., as shown in FIG. 12) may include the first horizontal intermediate line DH1', the second horizontal intermediate line DH2', and the third horizontal intermediate line DH3' at (e.g., in or on) the peripheral area PA outside the display area DA.

Figure 23:
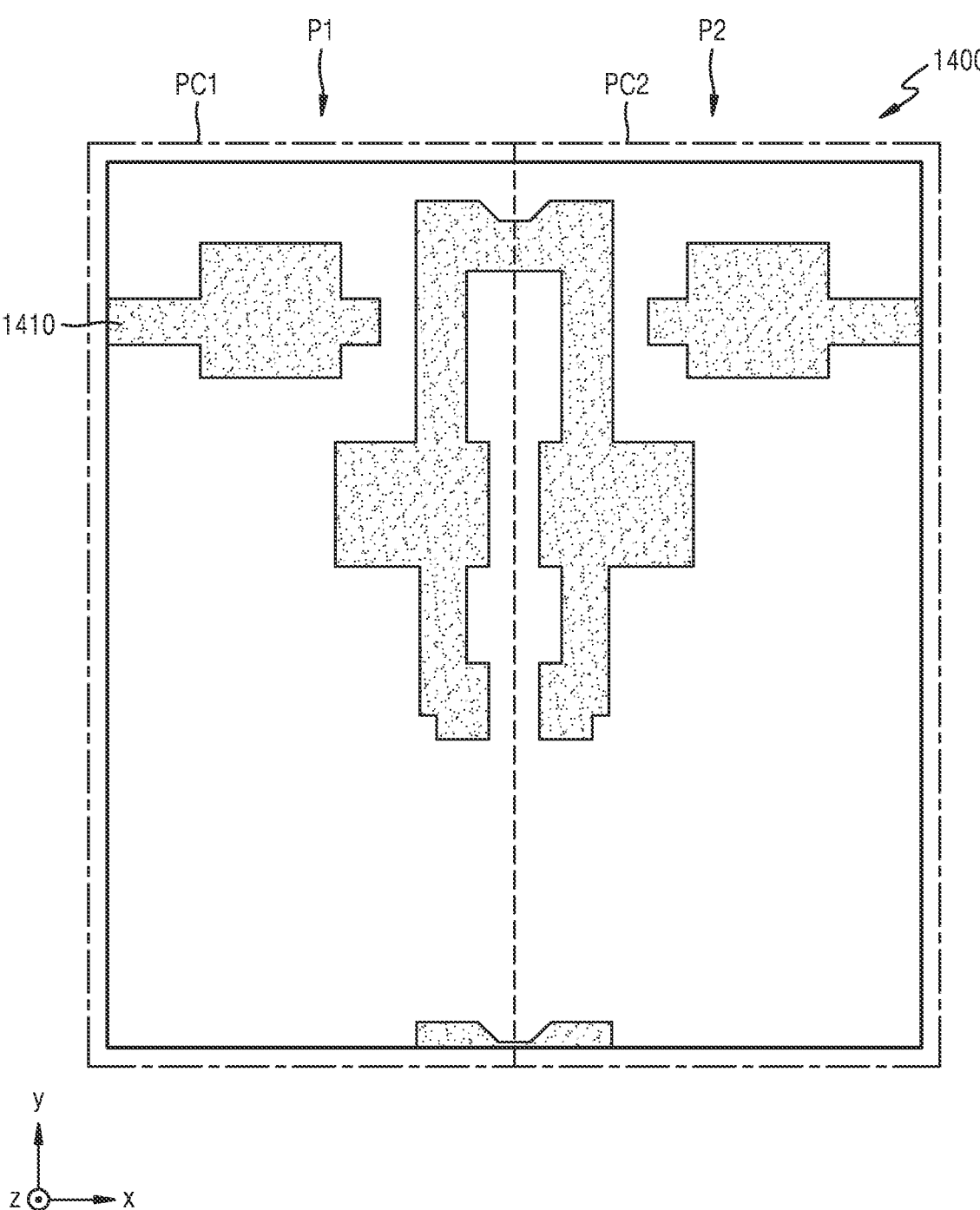
FIGS. 23-24 are enlarged plan views schematically illustrating layers positioned in a portion of a display apparatus according to an embodiment.
Figure 24:
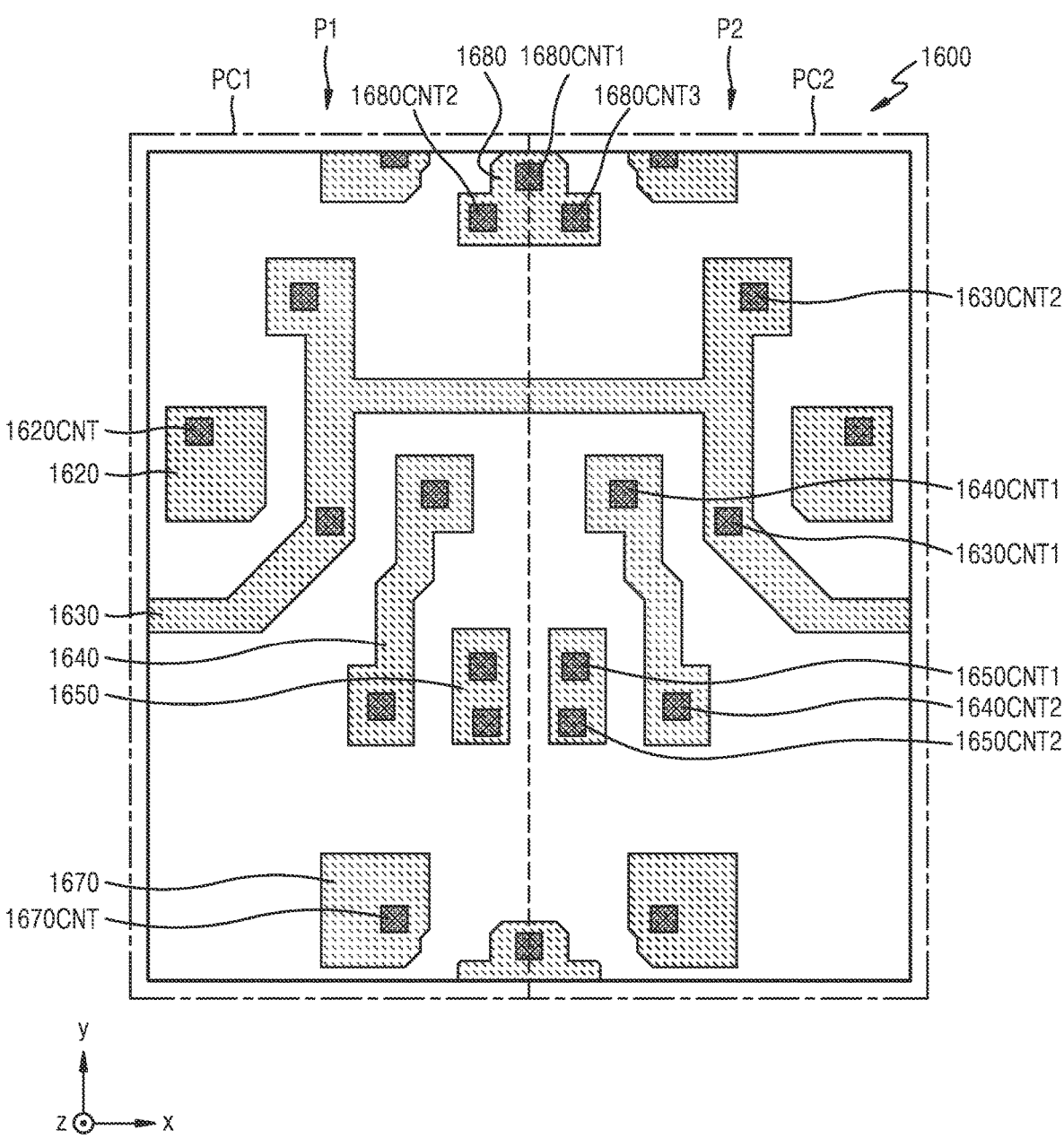
Figure 25:
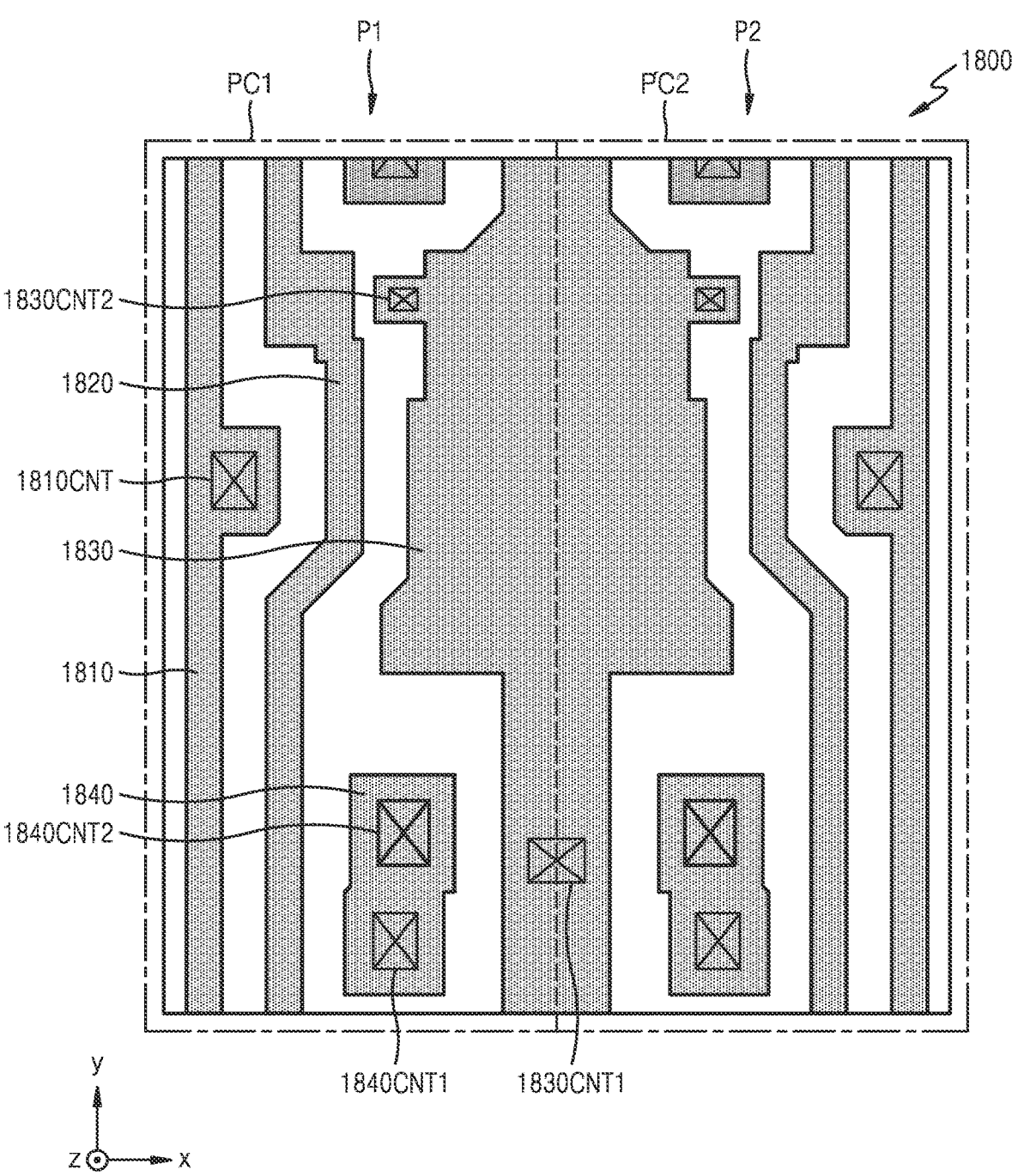
FIG. 25 is an enlarged plan view schematically illustrating a layer positioned in a portion of a display apparatus according to an embodiment.

FIGS. 23 and 24 are enlarged plan views schematically illustrating layers positioned in a portion of a display apparatus according to an embodiment. FIG. 25 is an enlarged plan view schematically illustrating a layer positioned in a portion of a display apparatus according to an embodiment. In the present embodiment, the shield layer 1410 has an isolated shape (e.g., an island shape). As described above, the structure shown in FIGS. 23 and 24 may be repeated in the first direction (e.g., the x-axis direction), and may also be repeated in the second direction (e.g., the y-axis direction). Accordingly, in such a repeating structure, the shield layer 1410 may be integrally formed as one body with respect to two pixels that are adjacent to each other in the first direction (e.g., the x-axis direction), but may have an isolated shape in a plan view. In other words, the shield layer 1410 extending in the first direction (e.g., the x-axis direction) may be spaced apart from an oxide semiconductor layer constituting the compensation transistor T3 and the first initialization transistor T4.

The shield layer 1410 may be electrically connected to the second initialization voltage line 1630 included in the first connection electrode layer 1600 as shown in FIG. 24. In other words, the second initialization voltage line 1630 may be electrically connected to the shield layer 1410 positioned thereunder via a contact hole 1630CNT2. Accordingly, the second initialization voltage Vint2, which is a constant or substantially constant voltage, may be applied to the shield layer 1410, and accordingly, the shield layer 1410 to which the second initialization voltage Vint2 is applied may shield the horizontal connection line 1710 from the third gate line 1310, which is an initialization gate line.

The shield layer 1410 may overlap with the horizontal connection line 1710, as described above. Also, the shield layer 1410 may further include a portion overlapping with the third gate line 1310, which is an initialization gate line, as needed or desired.

However, the shield layer 1410 may be electrically connected to a conductive layer to which a different constant voltage is applied, rather than to the second initialization voltage line 1630. For example, as shown in FIG. 25, which is an enlarged plan view schematically illustrating a layer positioned in a portion of a display apparatus according to an embodiment, the driving voltage line 1830 may be electrically connected to the shield layer 1410 disposed thereunder via a contact hole 1830CNT2. Accordingly, the first power voltage (or the driving voltage) ELVDD, which is a constant or substantially constant voltage, may be applied to the shield layer 1410, and accordingly, the shield layer 1410 to which the first power voltage (or the driving voltage) ELVDD is applied may shield the horizontal connection line 1710 from the third gate line 1310, which is an initialization gate line.

As described above, the horizontal connection line 1710 may be shielded from the third gate line 1310 by using the shield layer 1410 including an oxide semiconductor material. When the shield layer 1410 is formed using an oxide semiconductor material as described above, due to the characteristics of the oxide semiconductor material having high light transmittance, even when an illuminance sensor or the like is placed under the substrate 100, there may be no problem in the function of the illuminance sensor, and the horizontal connection line 1710 may be at least partially electromagnetically shielded from the third gate line 1310.

According to one or more embodiments of the present disclosure described above, a display apparatus capable of displaying a high-quality image may be implemented. However, the spirit and scope of the present disclosure is not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a first semiconductor layer on a substrate;
a first gate layer on the first semiconductor layer, and comprising a driving gate electrode;
a second gate layer on the first gate layer, and comprising an initialization gate line extending in a first direction;
a second semiconductor layer on the second gate layer, and comprising a shield layer configured to receive a constant voltage;
a second connection electrode layer on the second semiconductor layer, and comprising a horizontal connection line extending in the first direction; and a third connection electrode layer on the second connection electrode layer, and comprising a vertical connection line extending in a second direction crossing the first direction, wherein the second gate layer further comprises a first initialization voltage line extending in the first direction, and the shield layer is electrically connected to the first initialization voltage line.

2. The display apparatus of claim 1, further comprising a first connection electrode layer on the second semiconductor layer, and comprising a connection electrode electrically connecting the shield layer to the first initialization voltage line, wherein the second connection electrode layer is on the first connection electrode layer.

3. The display apparatus of claim 1, wherein the second semiconductor layer comprises an oxide semiconductor layer overlapping with the initialization gate line, and the shield layer comprises a same material as that of the oxide semiconductor layer.

4. The display apparatus of claim 3, wherein the shield layer and the oxide semiconductor layer are integral with each other as a single body.

5. The display apparatus of claim 3, wherein the shield layer extends in the first direction.

6. The display apparatus of claim 5, wherein the shield layer is an integral single body with respect to pixels located along the first direction.

7. The display apparatus of claim 3, wherein the shield layer overlaps with the horizontal connection line.

8. The display apparatus of claim 7, wherein the horizontal connection line is located within the shield layer in a plan view.

9. The display apparatus of claim 3, wherein the shield layer comprises a portion overlapping with the initialization gate line.

10. An electronic apparatus including the display apparatus of claim 1.

11. The electronic apparatus of claim 10, wherein the electronic apparatus is at least one of a smartphone, a tablet personal computer (PC), a laptop PC, a television (TV), or an advertisement board.

12. A display apparatus comprising:

a first semiconductor layer on a substrate;

a first gate layer on the first semiconductor layer, and comprising a driving gate electrode;

a second gate layer on the first gate layer, and comprising an initialization gate line extending in a first direction;

a second semiconductor layer on the second gate layer, and comprising a shield layer configured to receive a constant voltage;

a second connection electrode layer on the second semiconductor layer, and comprising a horizontal connection line extending in the first direction; and a third connection electrode layer on the second connection electrode layer, and comprising a vertical connection line extending in a second direction crossing the first direction, wherein the third connection electrode layer further comprises a data line extending in the second direction, and the vertical connection line is electrically connected to the data line and the horizontal connection line.

13. The display apparatus of claim 12, wherein the substrate comprises a display area, and a peripheral area outside the display area, and wherein the vertical connection line is electrically connected to the data line at the peripheral area.

14. The display apparatus of claim 13, wherein the vertical connection line and the data line are integral with each other as a single body.

15. The display apparatus of claim 13, wherein the horizontal connection line is electrically connected to the vertical connection line at the display area.

16. The display apparatus of claim 13, wherein the vertical connection line is connected to the horizontal connection line via a contact hole, and wherein the second connection electrode layer further comprises an auxiliary horizontal connection line spaced from the horizontal connection line, the auxiliary horizontal connection line being electrically insulated from the horizontal connection line and the data line, and having an extension axis that is the same as an extension axis of the horizontal connection line.

17. The display apparatus of claim 16, wherein the shield layer extends in the first direction, overlaps with the horizontal connection line, and does not overlap with the auxiliary horizontal connection line.

18. An electronic apparatus including the display apparatus of claim 12.

19. The electronic apparatus of claim 18, wherein the electronic apparatus is at least one of a smartphone, a tablet personal computer (PC), a laptop PC, a television (TV), or an advertisement board.

20. A display apparatus comprising:

a first semiconductor layer on a substrate;

a first gate layer on the first semiconductor layer, and comprising a driving gate electrode;

a second gate layer on the first gate layer, and comprising an initialization gate line extending in a first direction;

a second semiconductor layer on the second gate layer, and comprising a shield layer configured to receive a constant voltage;

a second connection electrode layer on the second semiconductor layer, and comprising a horizontal connection line extending in the first direction;

a third connection electrode layer on the second connection electrode layer, and comprising a vertical connection line extending in a second direction crossing the first direction; and a first connection electrode layer on the second semiconductor layer, and comprising a second initialization voltage line extending in the first direction, wherein the second connection electrode layer is on the first connection electrode layer, and the shield layer is electrically connected to the second initialization voltage line.

21. The display apparatus of claim 20, wherein the second semiconductor layer comprises an oxide semiconductor layer overlapping with the initialization gate line, and the shield layer comprises a same material as that of the oxide semiconductor layer.

22. The display apparatus of claim 21, wherein the shield layer extends in the first direction, and is spaced from the oxide semiconductor layer.

23. The display apparatus of claim 22, wherein the shield layer overlaps with the horizontal connection line.

24. The display apparatus of claim 23, wherein the shield layer comprises a portion overlapping with the initialization gate line.

25. An electronic apparatus including the display apparatus of claim 20.

26. The electronic apparatus of claim 25, wherein the electronic apparatus is at least one of a smartphone, a tablet personal computer (PC), a laptop PC, a television (TV), or an advertisement board.

27. A display apparatus comprising:

a first semiconductor layer on a substrate;

a first gate layer on the first semiconductor layer, and comprising a driving gate electrode;

a second gate layer on the first gate layer, and comprising an initialization gate line extending in a first direction;

a second semiconductor layer on the second gate layer, and comprising a shield layer configured to receive a constant voltage;

a second connection electrode layer on the second semiconductor layer, and comprising a horizontal connection line extending in the first direction; and a third connection electrode layer on the second connection electrode layer, and comprising a vertical connection line extending in a second direction crossing the first direction, wherein the third connection electrode layer further comprises a driving voltage line extending in the second direction, and wherein the shield layer is electrically connected to the driving voltage line.

28. The display apparatus of claim 27, wherein the second semiconductor layer comprises an oxide semiconductor layer overlapping with the initialization gate line, and the shield layer comprises a same material as that of the oxide semiconductor layer.

29. The display apparatus of claim 28, wherein the shield layer extends in the first direction, and is spaced from the oxide semiconductor layer.

30. The display apparatus of claim 29, wherein the shield layer overlaps with the horizontal connection line.

31. The display apparatus of claim 30, wherein the shield layer comprises a portion overlapping with the initialization gate line.

32. An electronic apparatus including the display apparatus of claim 27.

33. The electronic apparatus of claim 32, wherein the electronic apparatus is at least one of a smartphone, a tablet personal computer (PC), a laptop PC, a television (TV), or an advertisement board.

\* \* \* \* \*